United States Patent
Gorokhovsky

(10) Patent No.: US 6,929,727 B2
(45) Date of Patent: *Aug. 16, 2005

(54) RECTANGULAR CATHODIC ARC SOURCE AND METHOD OF STEERING AN ARC SPOT

(75) Inventor: Vladimir I. Gorokhovsky, Bozeman, MT (US)

(73) Assignee: G & H Technologies, LLC, Florence, MT (US)

( * ) Notice: Subject to any disclaimer, the term of this patent is extended or adjusted under 35 U.S.C. 154(b) by 14 days.

This patent is subject to a terminal disclaimer.

(21) Appl. No.: 10/667,279

(22) Filed: Sep. 18, 2003

(65) Prior Publication Data

US 2004/0055538 A1 Mar. 25, 2004

Related U.S. Application Data

(63) Continuation-in-part of application No. 09/958,703, filed as application No. PCT/CA00/00380 on Apr. 7, 2000, now Pat. No. 6,645,354.

(30) Foreign Application Priority Data

Apr. 12, 1999 (CA) .............................................. 2268659

(51) Int. Cl.$^7$ .............................................. C23C 14/32
(52) U.S. Cl. .............................. 204/298.41; 204/192.38
(58) Field of Search ........................ 204/192.38, 298.41

(56) References Cited

U.S. PATENT DOCUMENTS

| 3,793,179 A | 2/1974 | Sablev | |
| 4,448,659 A | 5/1984 | Morrison | 204/192.38 |
| 4,673,477 A | 6/1987 | Ramalingam | 204/192.38 |
| 4,724,058 A | 2/1988 | Morrison, Jr. | 204/192.38 |
| 5,298,136 A | 3/1994 | Ramalingam | 204/192.38 |
| 5,380,421 A | 1/1995 | Gorokhovsky | 204/298.41 |
| 5,387,326 A | 2/1995 | Buhl et al. | 204/192.38 |

(Continued)

FOREIGN PATENT DOCUMENTS

| DE | 4223592 A1 | 1/1994 |
| DE | 19739527 A1 | 3/1999 |

(Continued)

*Primary Examiner*—Rodney G. McDonald
(74) *Attorney, Agent, or Firm*—Mark A. Garzia, P.C.; Mark A. Garzia

(57) ABSTRACT

The invention provides an arc coating apparatus having a steering magnetic field source comprising steering conductors disposed along the short sides of a rectangular target behind the target, and a magnetic focusing system disposed along the long sides of the target in front of the target which confines the flow of plasma between magnetic fields generated on opposite long sides of the target. The plasma focusing system can be used to deflect the plasma flow off of the working axis of the cathode. Each steering conductor can be controlled independently. In a further embodiment, electrically independent steering conductors are disposed along opposite long sides of the cathode plate, and by selectively varying a current through one conductor, the path of the arc spot shifts to widen an erosion corridor. The invention also provides a plurality of internal anodes, and optionally a surrounding anode for deflecting the plasma flow and preserving a high ionization level of the plasma. The invention also provides a shield at floating potential, restricting the cathode spot from migrating into selected regions of the target evaporation surface outside of the desired erosion zone. The shield may be positioned immediately above the region of the target surface in the vicinity of the anode, protecting the anode from deposition of cathodic evaporate and providing better distribution of cathodic evaporate over the substrates to be coated. The invention further provides correcting magnets adjacent to the short sides of the target, to move the arc spot between the long sides.

20 Claims, 17 Drawing Sheets

U.S. PATENT DOCUMENTS

| | | | |
|---|---|---|---|
| 5,435,900 A | 7/1995 | Gorokhovsky | 204/298.41 |
| 5,468,363 A | 11/1995 | Falabella | 204/298.41 |
| 5,587,207 A | 12/1996 | Gorokhovsky | 427/571 |
| 5,840,163 A | 11/1998 | Welty | 204/192.38 |
| 5,997,705 A | 12/1999 | Welty | 204/298.41 |
| 6,645,354 B1 * | 11/2003 | Gorokhovsky | 204/192.38 |

FOREIGN PATENT DOCUMENTS

| | | |
|---|---|---|
| EP | 0495447 A1 | 7/1992 |
| EP | 0511153 A1 | 10/1992 |

* cited by examiner

RECTANGULAR CATHODIC ARC SOURCE AND METHOD OF STEERING AN ARC SPOT

CROSS REFERENCE TO RELATED APPLICATIONS

The present application claims the benefit under all relevant U.S. statutes, including 35 U.S.C. 120, to U.S. application Ser. No. 09/958,703 filed Jan. 3, 2002 now U.S. Pat. No. 6,645,354, titled RECTANGULAR CATHODIC ARC SOURCE AND METHOD OF STEERING AN ARC SPOT in the name of Vladimir Gorokhovsky, which claims the benefit under 35 U.S.C. 365 to PCT Appl. No. PCT/CA00/00380 filed Apr. 7, 2000, which in turn claims priority to Canadian Appl. No. 2,268,659 filed Apr. 12, 1999.

FIELD OF INVENTION

This invention relates to apparatus for the production of coatings in a vacuum. In particular, this invention relates to a vacuum arc coating apparatus having a rectangular cathodic arc source providing improved arc spot scanning and a plasma focusing system.

BACKGROUND OF THE INVENTION

Many types of vacuum arc coating apparatus utilize a cathodic arc source in which an electric arc is formed between an anode and a cathode plate in a vacuum chamber. The arc generates a cathode spot on a target surface of the cathode, which evaporates the cathode material into the chamber. The cathodic evaporate disperses as a plasma within the chamber, and upon contact with one or more substrates coats the substrates with the cathode material, which may be metal, ceramic etc. An example of such an arc coating apparatus is described in U.S. Pat. No. 3,793,179 issued Feb. 19, 1974 to Sablev, which is incorporated herein by reference.

An arc coating apparatus of this type is advantageous for use in the coating of large substrates and multiple substrates, due to the large surface area of the cathode which can be evaporated into a large volume coating chamber. However, in a large surface area cathode arc coating apparatus of this type a significant portion of the target evaporation surface of the cathode plate goes largely unused, due to the scanning pattern of arc spots which follows certain physical principles:

1. The arc discharge tends to move in a direction which reduces the voltage drop in the arc circuit, and the arc spot thus tends to migrate to regions on the target surface which are closest to the anodic current conductor. Where multiple current conductors traverse the cathode the arc spot will occasionally migrate into the region between conductors where it may remain for a considerable time because no steering mechanism is present to move the arc spot back to the desired evaporation zone.

2. In the case of metal cathodes the arc spot follows a retrograde motion according to the "anti-ampere force" principle, and is thus attracted to the coaxial magnetic force lines generated by the anodic current conductor.

3. In the case of a cathode formed from a material which does not have a melting phase, for example a sintered or graphite cathode, the arc spot moves according to the "ampere force" principle and is repelled from the coaxial magnetic force lines generated by the anodic current conductor.

4. The arc spot is attracted to the region where the tangential component of a transverse magnetic field is strongest.

5. The arc spot tends to migrate away from the apex of an acute angle at the point of intersection between a magnetic field line and the cathode target surface (the "acute angle" rule).

These effects result in a limited erosion zone relative to the available area of the target surface of the cathode plate, reducing the life of the cathode and dispersing cathodic evaporate into the coating chamber in non-uniform concentrations.

In a large area cathode arc coating apparatus using a metal cathode plate the anti-ampere motion of the arc spot and the tendency of the arc to seek the lowest voltage drop combine to largely confine the arc spot to the vicinity of the anodic conductor, substantially limiting the erosion zone to the region of the target surface surrounding the anodic conductor. This results in a very small area inside the coating chamber in which the cathodic evaporate is concentrated enough to apply a uniform coating to the substrates. However, it is not possible to construct the cathode plate so that the desired coating material is located only in the erosion zone, since the arc spot will occasionally stray out of the erosion zone and if the target surface is not entirely composed of the selected coating material the cathodic evaporate from outside the desired erosion zone will contaminate the coating on the substrates.

In the case of a cathode plate formed from a material which does not have a melting phase, the tendency of the arc spot to move in an ampere direction, away from the region of the anodic conductor, is opposed by the tendency of the arc discharge to settle toward the region of lowest voltage drop. In these cases the arc spot tends to move chaotically over the target surface of the cathode and the cathodic evaporate accordingly disperses in random locations and non-uniform concentrations within the coating chamber, rendering uniform coating of the substrates improbable. This random motion also causes the arc spot to move off of the target surface of the cathode and causes undesirable erosion of non-target portions of the cathode plate, for example the side edges.

U.S. Pat. No. 4,448,659 issued May 15, 1984 to Morrison, which is incorporated herein by reference, describes an arc coating apparatus providing a cathode in the form of a plate with a large target surface for creating cathodic evaporate. A confinement ring composed of a magnetically permeable material surrounds the cathode to confine the arc spot to the target surface. Such plasma sources can be used for the production of coatings on large and long articles, but present the following disadvantages:

1. Despite the initial low probability of the presence of cathodic spots on the protective ring, over time the cathodic evaporate coats the ring and cathodic spots are produced on the ring with increasing frequency. This results in contamination of the coating by the ring material, and ultimately in ring failure.

2. In self-steering cathodic arc sources it is not possible to use external magnetic fields in the vicinity of the target surface of the cathode. It is therefore not possible in such an apparatus to use a plasma-focusing magnetic field, as the influence of the focusing magnetic field makes the distribution of cathodic spots on the working surface of the cathode irregular and non-uniform. Any external magnetic field, for example for focusing or deflecting the arc plasma flow, interferes with the self-sustained magnetic field generated by the cathode and anode current conductors and disrupts the self-steering character of the cathode spot. However, the absence of magnetic focusing reduces the efficiency of the coating process and impairs the quality of substrate coatings, because the content of the neutral component (macroparticles, clusters and neutral atoms) in the region of the substrates, and thus in the substrate coating, increases.

3. A cathode in this type of plasma source rapidly becomes concave due to evaporative decomposition, and its useful life is therefore relatively short. Moreover, since the evaporation surface of the cathode becomes concave in a relatively short time it is practically impossible to use a high voltage pulse spark igniter in such a design, so that a mechanical igniter must be used which lowers working reliability and stability.

4. While the confinement ring prevents the arc spot from straying off of the target surface, it does not affect the tendency of the arc spot to migrate toward the anodic conductor in the case of metal cathodes, or to move chaotically over the target surface in the case of non-metal cathodes.

Accordingly, self-steering arc plasma sources tend to use the target surface inefficiently and the cathode thus has a relatively short useful life.

The erosion efficiency of the target surface can be improved by providing an arc spot steering system to steer the arc spot along a selected path about the target surface. This increases the size of the region within the coating chamber in which coating can occur.

For example, the scanning pattern of a cathode spot can be controlled by providing a closed-loop magnetic field source disposed beneath the target surface of the cathode, in a manner similar to that described in U.S. Pat. No. 4,724,058 issued Feb. 9, 1988 to Morrison, which is incorporated herein by reference. The magnetic field source establishes a magnetic field in a selected direction over the target surface, which directs the cathode spot in a direction substantially perpendicular to the direction of the magnetic field and thus provides more efficient evaporation of the target surface. This approach is based on the principle of arc spot motion whereby an arc spot is attracted to the region where the tangential component of a transverse magnetic field is strongest.

However, this still significantly limits the area of the target surface of the cathode which is available for erosion, because this type of arc coating apparatus creates a stagnation zone in the region where the tangential component of the magnetic field is strongest. The cathode spot eventually settles in the stagnation zone, tracing a retrograde path about the erosion zone and creating a narrow erosion corridor on the target surface. This limits the uniformity of the coating on the substrates and reduces the working life of the cathode.

U.S. Pat. No. 5,997,705 issued Dec. 7, 1999 to Welty, which is incorporated herein by reference, teaches a rectangular cathode plate in which the evaporation surface is located on the peripheral edge of the cathode plate, the arc spot being confined to the evaporation surface by cathode shields disposed over opposed faces of the cathode plate. Deflecting electrodes disposed about the cathode plate direct the plasma stream in two directions, parallel to the faces of the cathode plate.

In this apparatus the substrates must surround the edges of the cathode plate, and the cathode plate occupies most of the space within the apparatus. Thus, in order to coat a significant number of substrates the cathode plate, and thus the apparatus itself, must be extremely large. Also, filtration in this apparatus is poor, since the substrates are directly exposed to droplets and macroparticles entrained in the cathodic evaporate.

A deflecting electrode is described in U.S. Pat. No. 5,840,163 issued Nov. 24, 1998 to Welty, which is incorporated herein by reference. This patent teaches a rectangular vacuum arc plasma source in which a deflecting electrode is mounted inside the plasma duct and either electrically floating or biased positively with respect to the anode. However, this device requires a sensor which switches the polarity of the magnetic field when the arc spot on the rectangular source has reached the end of the cathode, in order to move the arc spot to the other side of the cathode. This results in an undesirable period where the magnetic field is zero; the arc is therefore not continuous, and is not controlled during this period. Consequently this 'psuedo-random' steering method cannot consistently produce reliable or reproducible coatings.

U.S. Pat. No. 4,673,477 to Ramalingam proposes that the magnetic field source can be moved to shift the magnetic field lines and increase the utilization efficiency of the target surface. However, the mechanical adaptations required for such a system make the apparatus too complicated and expensive to be practical.

Where an external magnetic field is present the arc spot follows the "acute angle" rule, according to which the arc spot tends to migrate away from the apex of an acute angle at the point of intersection between a magnetic field line and the cathode target surface. The basic principle is that a cathodic spot formed by a vacuum arc in a fairly strong magnetic field (in the order of 100 Gauss), the force lines of which cross the surface of the cathode at an acute angle, will move in a reverse (retrograde) direction perpendicular to the tangential component of the field and, concurrently, displace away from the apex of the angle (for example, see Cathodic Processes of Electric Arc by Kesaev I. G., Nauka, 1968). This results in the arc spot settling beneath the apex of the arch-shaped portion of the magnetic field which projects over the target surface.

U.S. Pat. No. 5,587,207 issued Dec. 24, 1996 to Gorokhovsky, which is incorporated herein by reference, teaches that cathode spot confinement under a closed loop-type linear anode can be enhanced by a conductor which encases the anode to form a closed loop magnetic coil, with the magnetic field lines oriented in the direction shown in FIGS. 29 and 30 therein. Simultaneous use of both the closed-loop magnetic steering coil behind the cathode and a closed-loop linear anode in front of the target evaporation surface (with or without an enclosed magnetic coil) results in a synergistic improvement of arc discharge stability and thus cathode spot motion. The anode can be configured in any desired pattern, the configuration thereof being limited only by the periphery of the target surface. The arc spot will scan the target surface under the influence of the transverse magnetic field (in an ampere direction in the case of cathodes of carbon and related sintered materials or in an anti-ampere direction in the case of metal cathodes), virtually unaffected by the current flowing through the anodic conductor.

A disadvantage of this approach is that the arc spot will occasionally migrate from the selected erosion zone to another part of the cathode target surface where the intensity of the transverse magnetic field is small and, there being no means available to return the arc spot to the desired erosion zone, will stagnate in the low magnetic field region. In the case of a carbon-based cathode plate, when the velocity of arc spot movement is low enough the arc spot can settle in any stagnation zone where the transverse magnetic field is close to zero, and will not return to the erosion zone.

U.S. Pat. No. 5,435,900 issued Jul. 25, 1995 to Gorokhovsky, which is incorporated herein by reference, discloses a deflecting magnetic system surrounding a parallelipedal plasma guide, in which the deflecting conductors force the plasma toward the substrate holder. However, this patent does not address the problem of magnetically steering an arc spot around a rectangular cathode plate in the presence of a deflecting magnetic field.

SUMMARY OF THE INVENTION

The present invention overcomes these disadvantages by providing a steering magnetic field source comprising a plurality of electrically independent closed-loop steering conductors disposed in the vicinity of the target surface. In the preferred embodiment each steering conductor can be controlled independently of the other steering conductors.

The steering conductors may be disposed in front of or behind the target surface of the cathode plate. When disposed in front of the target surface the steering magnetic field lines intersect with the target surface at an obtuse angle, which obviates the motion-limiting effect of the acute angle principle and allows the arc spot to move over a larger region of the target surface, thereby further increasing the size of the erosion zone.

Steering conductors disposed in front of the target surface can also serve as focusing conductors, which confine the plasma and direct it toward the substrates. In these embodiments opposed steering/focusing conductors disposed along the long sides of the cathode plate generate magnetic cusps which create a magnetic pathway within which the plasma flows toward the substrates. Additional focusing conductors may be disposed along the plasma duct downstream, preferably with magnetic fields that overlap within the plasma duct to create a continuous magnetic wall along the plasma duct.

Increasing the current through one steering conductor increases the strength of the magnetic field generated by that conductor relative to the strength of the magnetic field of the steering conductor along the opposite side of the cathode plate, shifting the magnetic field on the opposite side of the cathode plate transversely. Selective unbalancing of the steering conductor currents can thus compensate for the magnetic influence of the focusing conductors, and if desired can increase the effective breadth of the erosion zone to thus provide more uniform erosion of the target surface and a larger area within the coating chamber in which the cathodic evaporate is dispersed at concentrations sufficient to uniformly coat the substrates.

In a further embodiment, groups of steering conductors are disposed along opposite sides of the cathode plate. By selectively applying a current through one conductor in each group, the path of the arc spot shifts to an erosion corridor defined by the active steering conductor.

The present invention further provides means for restricting the cathode spot from migrating into selected regions of the target evaporation surface outside of the desired erosion zone. The invention accomplishes this by providing a shield at floating potential positioned over one or more the selected regions of the target evaporation surface, which prevents the arc spot from forming in or moving into the shielded region. In one preferred embodiment the shield is positioned immediately above the region of the target surface in the vicinity of the anode, spaced from the target surface. The evaporation zone is thus restricted to the area of the target surface surrounding the shield, protecting the anode from deposition of cathodic evaporate and providing better distribution of cathodic evaporate over the substrates to be coated, which results in more uniform coatings over a greater coating area.

The shield can be used to keep arc spots away from any region where the negative conductor traverses the cathode, which represents the lowest voltage drop relative to the anode. Where a large anode or multiple anodes are provided the shield restrains the arc spot from migrating into the region of the cathode located beneath an anode, where most of evaporated material would be trapped by the anode rather than flowing to the substrate.

Further, the presence of the shield allows the target evaporation surface of the cathode plate to be constructed of a combination of the coating material and another material, for example an expensive coating material such as titanium or platinum in the desired erosion zone and an inexpensive material such as steel outside of the erosion zone. The steel portion of the target surface may be shielded by a floating shield of the invention to prevent cathode spot formation and motion thereon, and thus prevent contamination of the coating while optimizing utilization of the expensive coating material.

In an arc coating apparatus utilizing a magnetic steering system, regions where the transverse magnetic field is low can be shielded in the same manner to exclude movement of the arc spot into these regions and create the desired pattern of erosion. In this embodiment of the invention the target may be placed on the poles of magnetron-type magnetic system of the type described in U.S. Pat. No. 4,724,058 issued Feb. 9, 1988 to Morrison, which is incorporated herein by reference. The region of the evaporation surface located about the central part of target cathode, where the tangential component of the magnetic field is too weak to confine arc spots, may be shielded by a floating shield which prevents the arc spot from migrating into the stagnation area created between the magnetic fields generated by the magnetron.

The invention further provides a magnetic focusing system which confines the flow of plasma between magnetic fields generated on opposite sides of the coating chamber. This prevents the plasma from contacting the surface of the housing, to avoid premature deposition, and increases the concentration of plasma in the vicinity of the substrate holder.

In a further embodiment the plasma focusing system can be used to deflect the plasma flow off of the working axis of the cathode, to remove the neutral component of the plasma which otherwise constitutes a contaminant. In this embodiment the plasma focusing coils are disposed in progressively asymmetric relation to the working axis of the cathode, to deflect the flow of plasma along a curvate path toward a substrate holder.

The present invention thus provides a vacuum arc coating apparatus comprising a rectangular cathode plate having opposed long sides and opposed short sides and connected to a negative pole of an arc current source, the cathode plate having an evaporation surface, a coating chamber defined by the evaporation surface and a housing, containing a substrate holder, at least one anode within the coating chamber spaced from the evaporation surface, connected to a positive pole of a current source, an arc igniter for igniting an arc between the cathode and the anode and generating an arc spot on the target evaporation surface, a magnetic steering system comprising at least first and second steering conductors respectively arranged behind the evaporation surface along the short sides of the cathode plate, the first steering conductor carrying a current in a direction opposite to a direction of current in the second steering conductor, the first and second steering conductors being disposed in the vicinity of the evaporation surface so that a magnetic field generated thereby exerts a magnetic influence on the arc spot, and a magnetic focusing system comprising at least first and second substantially linear focusing conductors arranged in front of the evaporation surface along opposite long sides of the cathode plate, the focusing conductors carrying a current in opposite directions and being electrically independent of the steering conductors, wherein the magnetic fields generated by the steering conductors and the magnetic fields generated by the focusing conductors are oriented in the same direction in front of the evaporation surface to thereby direct plasma away from the evaporation surface and direct arc spots in a desired direction around the evaporation surface.

The present invention further provides a method of steering an arc spot around a rectangular cathode plate having long sides and short sides and a front evaporation surface, comprising the steps of a. generating a magnetic field in front of the evaporation surface in a first direction along a first long side of the cathode plate and generating a magnetic field in front of the evaporation surface in a second direction opposite the first direction along a second long side of the cathode plate, and b. generating a magnetic field behind the evaporation surface in a third direction along a first short side of the cathode plate and generating a magnetic field behind the evaporation surface in a fourth direction opposite the third direction along a second short side of the cathode plate, wherein the magnetic fields extend in front of the evaporation surface to steer the arc spot along an erosion zone around the evaporation surface.

The present invention further provides a method of steering an arc spot around a rectangular cathode plate having long sides and short sides and a front evaporation surface, the cathode plate being contained within an apparatus having a plurality of electrically isolated anode blocks spaced from the cathode plate in front of the evaporation surface, comprising the step of selectively activating and deactivating anode blocks to move the arc spot around the evaporation surface.

Further aspects and embodiments of the invention and of apparatus for implementing the methods of the invention will be apparent from the detailed description which follows.

BRIEF DESCRIPTION OF THE DRAWINGS

In drawings which illustrate by way of example only a preferred embodiment of the invention.

FIG. 7b is a side elevation of the arc coating apparatus of FIG. 7a;

DETAILED DESCRIPTION OF THE INVENTION

Figure 1:
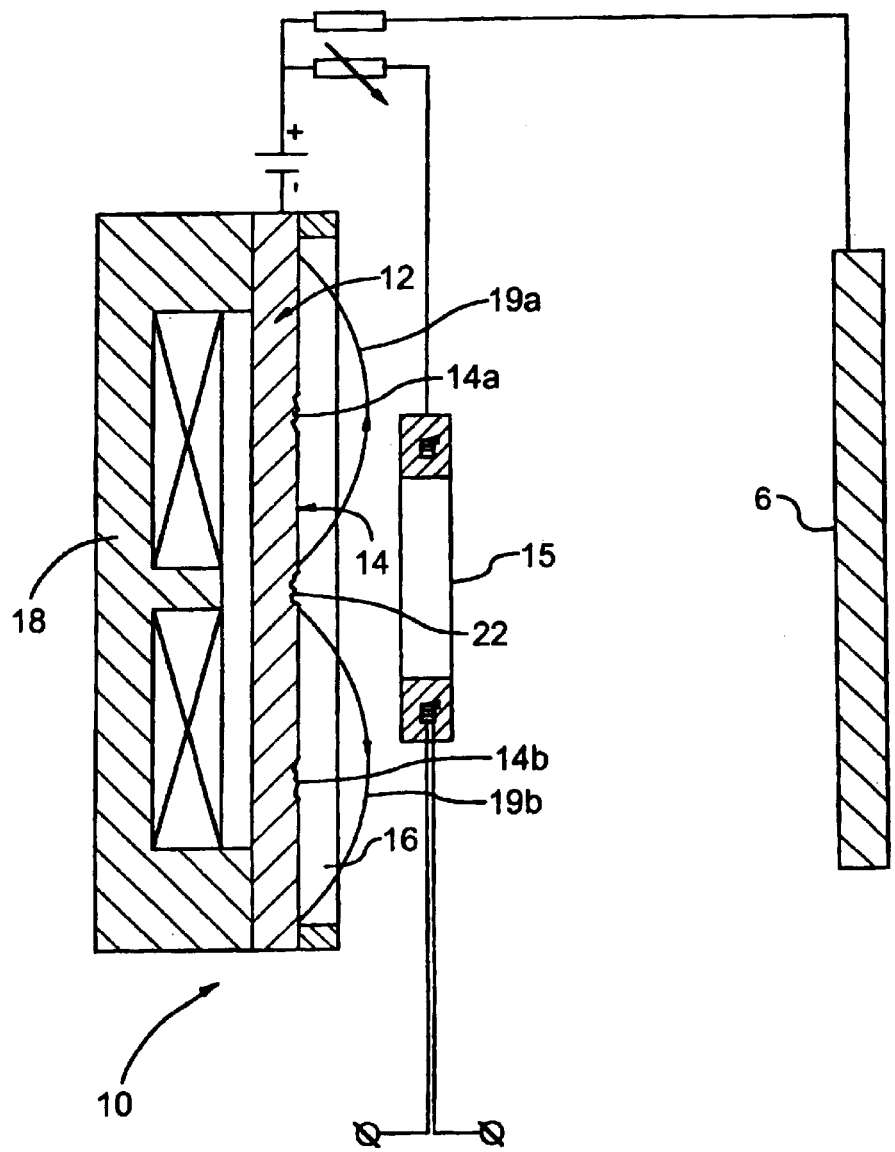
FIG. 1 is a schematic cross-section of a prior art large area cathode vacuum arc plasma source having a magnetic steering system disposed behind the cathode plate.

FIG. 1 illustrates a prior art large area rectangular cathode vacuum arc plasma source of the type described and illustrated in U.S. Pat. No. 4,724,058 to Morrison, which is incorporated herein by reference. The apparatus 10 comprises a cathode plate 12 having a target evaporation surface 14 which may be circumscribed by a confinement member 16 composed of a magnetically permeable material. As described in U.S. Pat. No. 5,587,207 issued Dec. 24, 1996 to Gorokhovsky, which is incorporated herein by reference, an anode 15 disposed opposite the target surface 14, which may be composed of a metallic or a non-metallic coating material.

A current applied between the cathode 12 and the anode 15 creates an arc which generates an arc spot on the target surface 14. In the prior art apparatus shown the scanning pattern of the cathode spot is controlled by a closed-loop magnetic field source 18 disposed behind the cathode 12. The magnetic field source 18 establishes magnetic fields 19a, 19b in a opposite directions over the target surface 14 which moves the arc spot in a retrograde motion according to the formula $$V_{cs} = -c[I_{as}(B_t)]$$

in which Vcs is the velocity of the arc spot, Ias is the arc spot current, Bt is the strength of the transverse magnetic field, and c is a coefficient based on the material of the target surface 14. The arc spot thus traces a retrograde path about the cathode plate following the length of the magnetic field source.

When trapped within the static magnetic field produced by the magnetic field source 18, the cathode spot is directed toward the apex of the magnetic field lines 20, the region where the tangential component of a magnetic field is strongest, which causes the target surface 14 to evaporate along a narrow evaporation corridor 14a. Further, the oppositely oriented magnetic field lines 19a, 19b create a stagnation zone at 22 in which the cathode spot can settle and remain for prolonged periods, eroding the target surface 14 unduly in the stagnation zone 22. Both of these effects result in poor utilization efficiency of the target surface 14. Accordingly, in the apparatus described in U.S. Pat. No. 4,724,058 the magnetic field is activated only intermittently during the coating process, the arc spot being free to scan randomly most of the time. Since the cathode spot is largely self-steering, magnetic fields cannot be used for plasma focusing.

Figure 2:
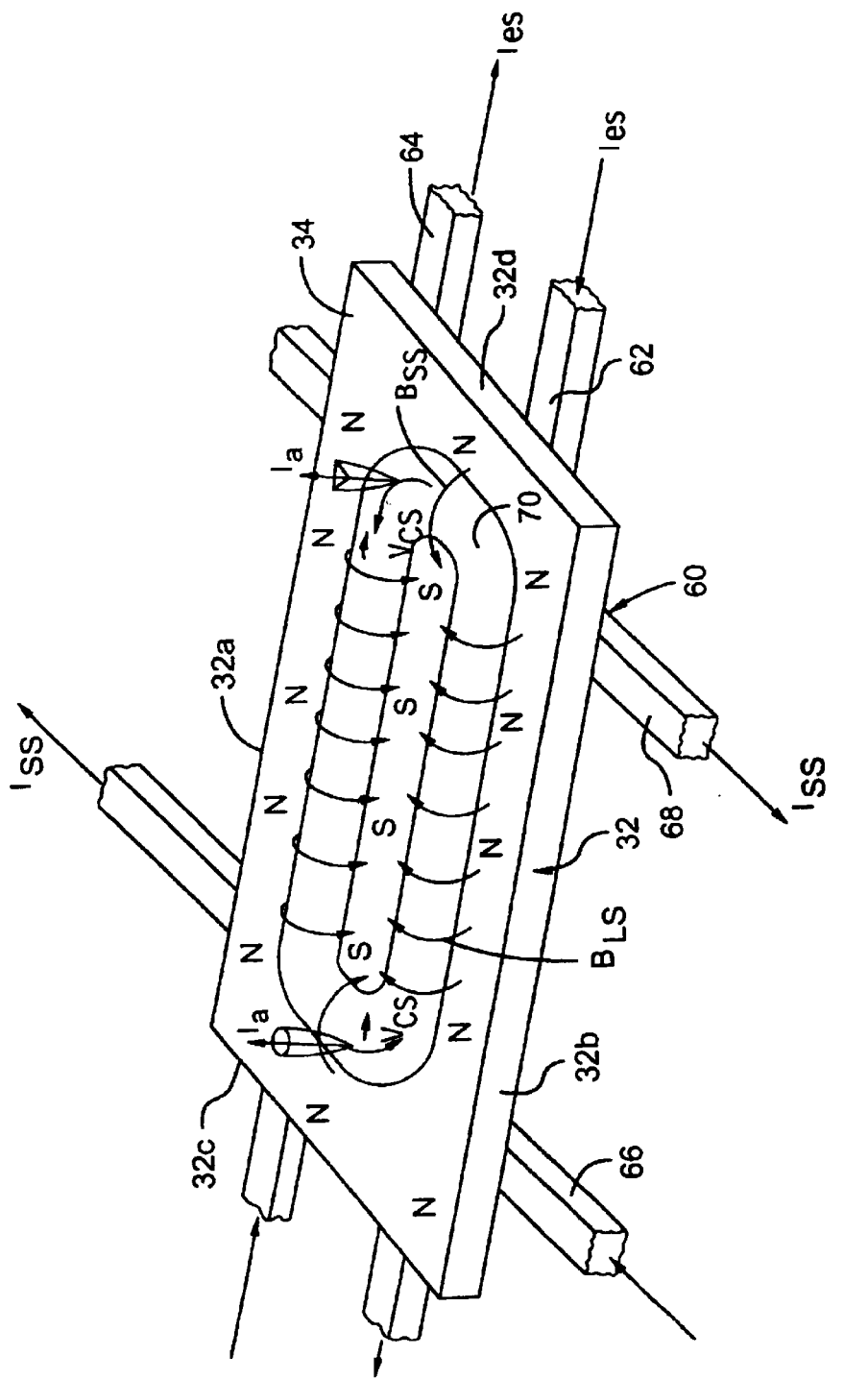
FIG. 2 is a partial perspective view illustrating the distribution of magnetic field lines produced by a magnetic steering system according to one embodiment of the invention.

FIG. 2 illustrates a preferred embodiment of a cathode spot steering system 60 according to the invention. In the embodiment illustrated in FIG. 2 the steering system 60 is disposed behind the cathode plate 32 (i.e. on the side of the cathode plate 32 opposite to the target evaporation surface 34), which has long sides 32a, 32b and short sides 32c, 32d. The steering system 60 comprises linear conductors 62 and 64 respectively disposed in parallel with the long sides 32a, 32b of the cathode plate 32 having a current $I_{LS}$ applied thereto in the direction shown, and linear conductors 66 and 68 respectively disposed in parallel with the short sides 32c, 32d of the cathode plate 32 having a current $I_{SS}$ applied thereto in the direction shown. The conductors 62, 64 are disposed behind the cathode plate in the vicinity of the target surface 34 so that the magnetic fields generated thereby intersect the target surface 34, and thus influence arc spot formation and motion. The steering conductors 62, 64, 66, 68 may alternatively be disposed in front of the cathode plate, as in the embodiment illustrated in FIGS. 4 to 6, described below. In either case the steering magnetic field source 60 generates a magnetic field defining an erosion zone 70 along the target surface 34.

Figure 2A:
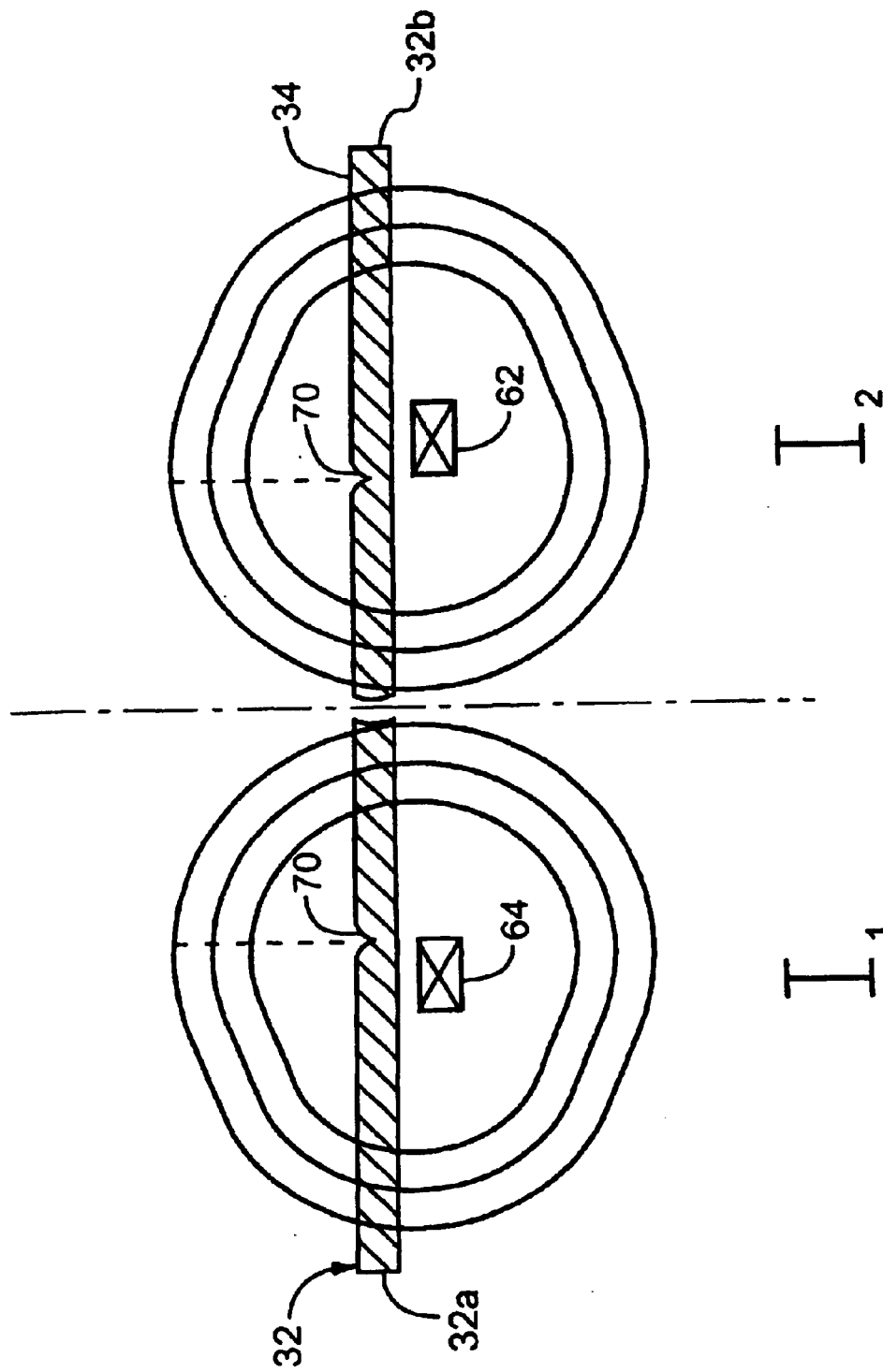
FIG. 2a is a schematic elevation illustrating balanced magnetic field lines produced by the magnetic steering system of FIG. 2.

The configuration and polarities of the magnetic fields generated by the steering conductors 62, 64, 66 and 68 are illustrated by the magnetic field lines in FIG. 2. The magnetic field lines projecting above the target surface 34 are arch-shaped, and on opposite sides of the cathode 32 are oriented in opposite directions. Arc spots moving within the erosion zone 70 are attracted toward the apex of the arch-shaped magnetic field lines, where the tangential component of the magnetic field which projects beyond the target surface 34 is strongest. When the current through opposite conductors, for example steering conductors 62 and 64, is equal or balanced (i.e. $I_1=I_2$), the arc spot travels along a narrow erosion corridor largely confining the erosion zone 70 beneath the apex of the magnetic field lines symmetrically about the longitudinal centre of the cathode plate 32, as shown in FIG. 2a.

According to one aspect of the invention, by increasing the current in one steering conductor relative to the current in the steering conductor on the opposite side of the cathode plate 32, the magnetic field becomes unbalanced and the magnetic field lines on the side of the cathode 32 with the weaker magnetic field shift toward the side of the cathode 32 with the stronger magnetic field. In the preferred embodiment each linear conductor 62, 64, 66, 68 is thus electrically independent and can be controlled in isolation.

Figure 2B:
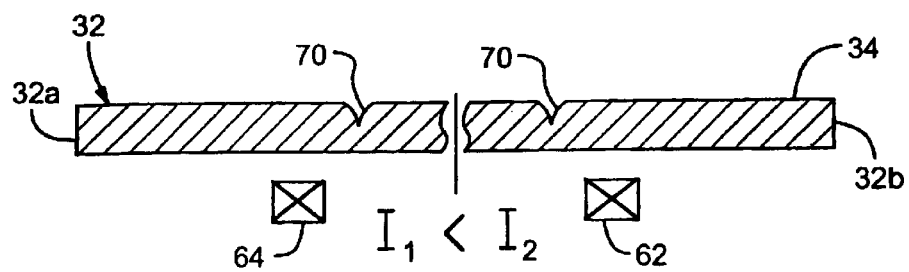
FIG. 2b is a schematic elevation illustrating an erosion corridor produced by the magnetic steering system of FIG. 2 unbalanced in a first direction.
Figure 2C:
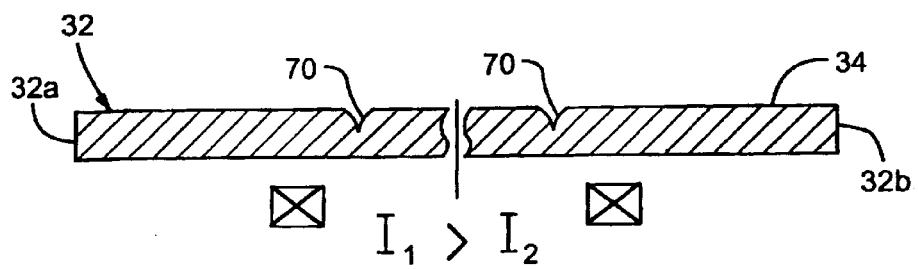
FIG. 2c is a schematic elevation illustrating an erosion corridor produced by the magnetic steering system of FIG. 2 unbalanced in a second direction.

For example, in FIG. 2b the current in steering conductor 62 has been increased relative to the current in steering conductor 64, so that $I_1<I_2$. The resulting unbalancing of the strength of the magnetic fields generated thereby distorts the magnetic field generated by the conductor 64 and shifts its magnetic field lines toward the conductor 62. The point of the magnetic field generated by conductor 64 where the tangential component of the transverse magnetic field is strongest has thus shifted away from the side 32a and toward the centre of the cathode 32, and arc spots accordingly trace a path closer to the centre of the cathode 32. By unbalancing the current in conductors 62, 64 so that conductor 64 generates the stronger magnetic field and $I_1>I_2$, the path of the arc spot shifts away from the side 32b and toward the centre of the cathode, as shown in FIG. 2c.

The degree of unbalancing, i.e. the current differential between conductors 62 and 64, determines the extent of the magnetic field shift. By unbalancing the conductors 62, 64 at selected current levels and in properly timed intervals coinciding with the motion of the arc spot, a plurality of arc spot paths are created. This substantially increases utilization efficiency of the target surface.

A similar effect is achieved along the short sides 32c, 32d of the cathode 32 by unbalancing the current through the conductors 66, 68. The path of the arc spot will shift toward the centre of the cathode 32 along the side with the weaker magnetic field. However, it will be appreciated that if the cathode plate 32 is narrow enough that the magnetic fields generated along the long sides 32a, 32b by conductors 62, 64 are relatively close together, the conductors 66, 68 along the short sides 32c, 32d may become unnecessary; the arc spot will naturally migrate back and forth between the long magnetic fields, or as the arc spot reaches the end of its path along one long side 32a or 32b the magnetic field can be selectively decreased or momentarily deactivated along that side and the arc spot will move to the other side 32b or 32a where the magnetic field is stronger.

The closing conductors 62a, 64a, 66a, 68a, which are parallel to the target surface 34 and respectively complete the circuit for each steering conductor 62, 64, 66, 68, are maintained well away from the cathode plate 32 and the housing 38. This ensures that the magnetic fields generated by the closing conductors 62b, 64b, 66b, 68b or 72a, 72b do not influence arc spot formation or plasma flow patterns.

In operation, when an arc is created by applying a current between the anode and the cathode plate, an arc spot generated on the target surface 34 settles in an erosion corridor 70 defined within the steering magnetic fields generated by the steering conductors 62, 64, 66, 68. The arc spot follows a retrograde motion along the erosion zone 70. The magnetic field is periodically unbalanced by a control switch (not shown), which intermittently increases the current through conductor 62 to increase the strength of the magnetic field generated thereby and shift the arc spot path away from the side 32a, and alternately increases the current through conductor 64 to increase the strength of the magnetic field generated thereby and shift the arc spot path away from the side 34a. This effectively widens the erosion zone 70 to increase the utilization efficiency of the target surface, improving the quality of the coating and the durability of the cathode 32.

Figure 3:
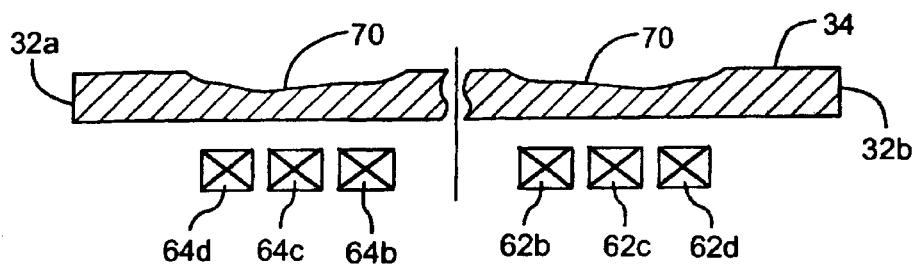
FIG. 3 is a schematic elevation illustrating a variation of the embodiment of FIG. 2 in which multiple steering conductors are disposed along the long sides of the cathode plate.

In a variation of this embodiment, illustrated in FIG. 3, a plurality of steering conductors 62b, 62c, 62d and 64b, 64c, 64d are provided respectively along the long sides of the cathode plate 32. In this variation the steering conductors 62b, 62c, 62d and 64b, 64c, 64d are activated or modulated alternatively so that the erosion corridor, being located generally above the currently active steering conductor 62b, 62c or 62d on one side and 64b, 64c or 64d on the other side, can be shifted in a widthwise direction over the cathode plate 32 to increase the breadth of the erosion zone 70.

In the embodiment of FIG. 3 as many steering conductors may be provided as the size of the cathode plate 32 will practically allow. One steering conductor 62b, 62c or 62d and 64b, 64c or 64d should be active on each side of the cathode plate 32 at any particular time, in order to avoid creating a stagnation zone in which the cathode spot may become trapped. However, where the conductors on each side of the cathode 32 are close together, simultaneously exciting more than one conductor on each side of the cathode 32 can allow for a more elaborate erosion pattern which, properly controlled, can increase the utilization efficiency of the target surface 34 even further.

In the operation of this embodiment, when an arc is created by applying a current between the anode and the cathode plate, an arc spot generated on the target surface 34 settles in an erosion corridor 70 defined within the steering magnetic fields generated by the active steering conductors, for example 62b and 64b. The magnetic field is periodically shifted by a control switch (not shown), which switches the current between the conductors 62b, 62c and 62d on the long side 32a and between the conductors 64b, 64c and 64d on the long side 32b, to thereby and shift the arc spot path to the vicinity of the active steering conductor. This widens the erosion zone 70 to increase the utilization efficiency of the target surface, improving the quality of the coating and the durability of the cathode 32.

It will be appreciated that in each of these embodiments the active steering conductor does not need to be deactivated completely when another steering conductor is activated, or fully energized when activated, in order to achieve the desired erosion pattern in the erosion zone 70. The current can be modulated differentially as between the various steering conductors to generate the same result.

Figure 4:
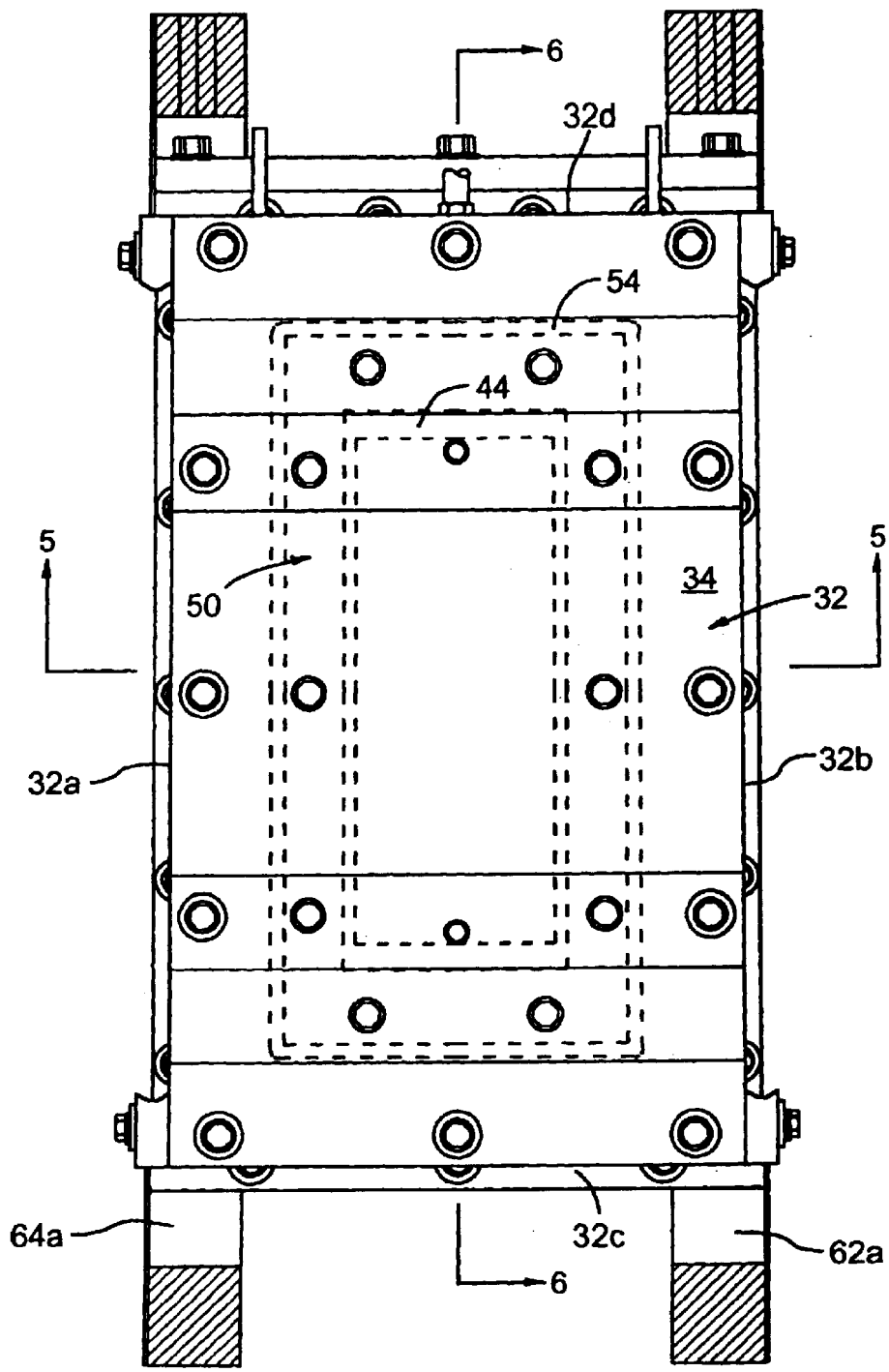
FIG. 4 is a plan view of a further preferred embodiment of a large area cathode arc source of the invention.
Figure 5:
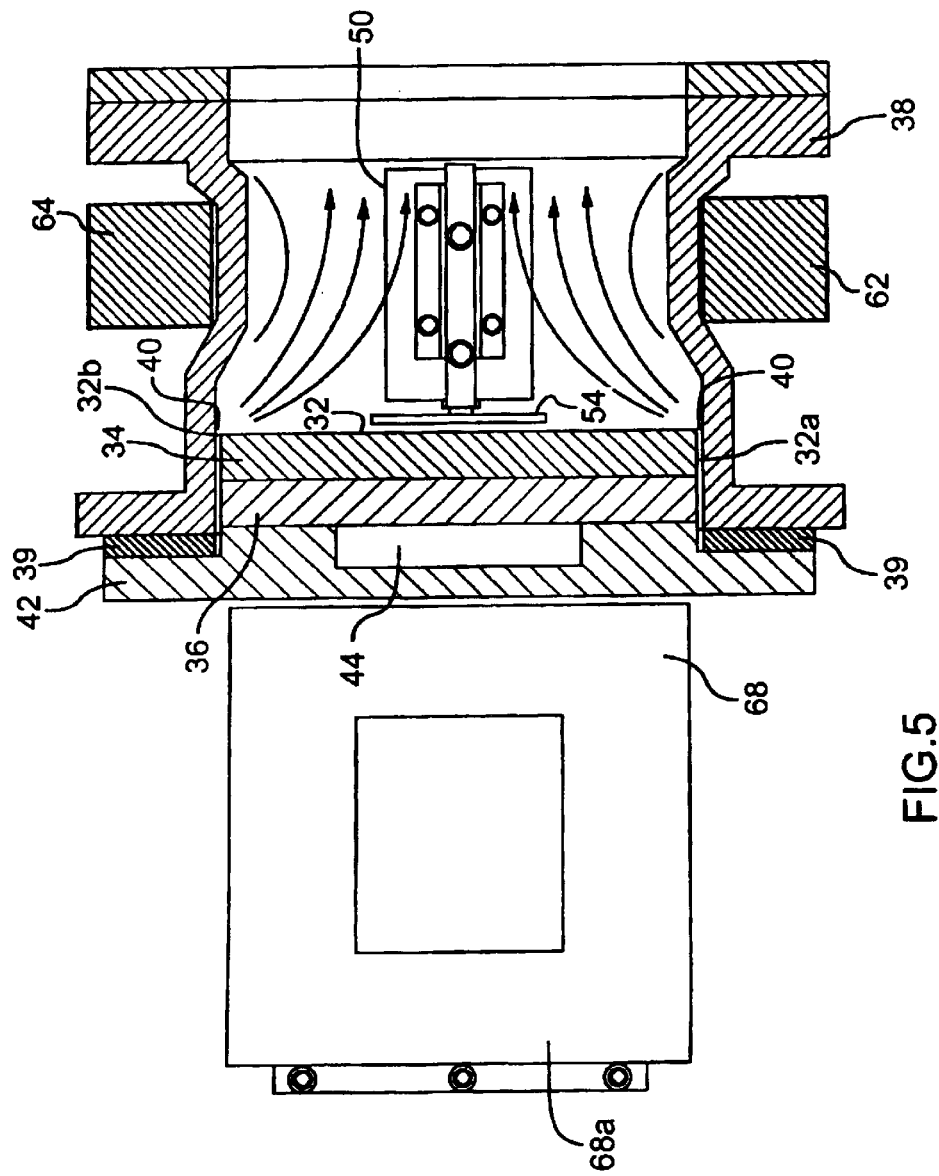
FIG. 5 is a cross-section of the apparatus of FIG. 4 taken along the line 5—5.
Figure 6A:
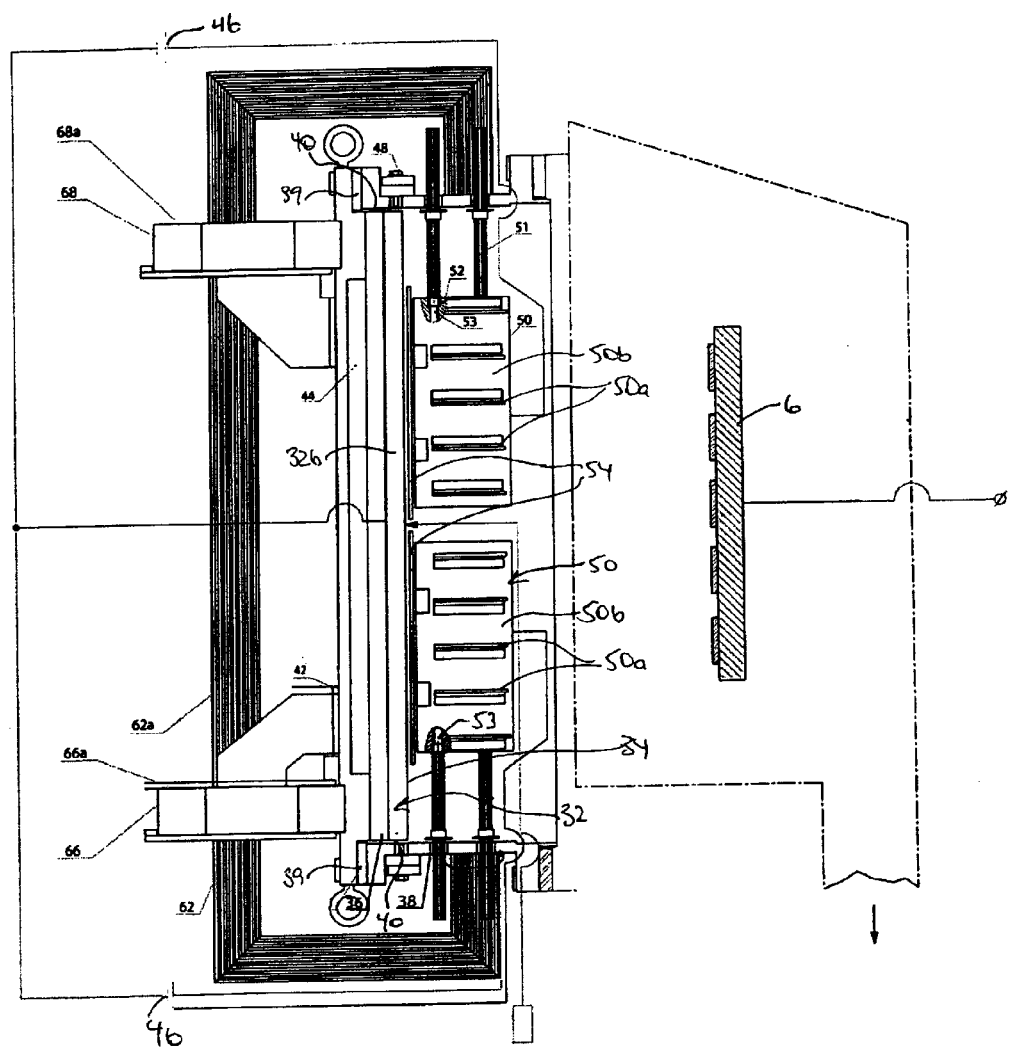
FIG. 6a is a cross-section of the apparatus of FIG. 4 taken along the line 6—6.

FIGS. 4 to 6 illustrate a further embodiment of the invention providing arc spot shielding. An arc coating apparatus 30 is provided with a rectangular cathode plate 32 comprising a target evaporation surface 34 and a supporting plate 36 mounted to a cathode holder 42, within a coating chamber defined by the target surface 34 and a housing 38. In the preferred embodiment the target surface 34, which may be composed of any suitable metallic or a non-metallic coating material, has long sides 32a, 32b and short sides 32c, 32d and is electrically insulated from the housing 38 by dielectric spacers 39 isolating the cathode holder 42 from the supporting plate 36 and spaced from the housing 38 by a gap 40. The target surface 34 may be formed from different materials, for example titanium and aluminum or titanium and chromium, integrated in a mosaic fashion along the erosion zone 70 to produce a composite metallic plasma for applying coatings such as TiAlN, TiCrN or the like.

The cathode plate 32 is spaced from the cathode holder 42 to create a coolant chamber 44 for circulating a coolant such as water, and is connected to the negative pole of an arc current source (not shown). A conventional high voltage pulse igniter 48 is mounted through a dielectric sleeve traversing the wall of the housing 38.

Suspended from the housing 38 by a mounting assembly 51 is a plurality of linear anodes 50, spaced from the cathode plate 32 and mounted to respective anode holders 52 which may be provided with a coolant channel 53 for circulation of a coolant such as water. The anodes 50 are connected to the positive pole of the arc current sources 46. In the preferred embodiment the anodes 50 each comprise a series of baffles or "fins" 50a which may be disposed generally orthogonally in relation to an anode body 50b, to increase the effective anodic surface area. The fins 50a and anode body 50b are each preferably oriented in a direction parallel to the direction of the plasma flow, i.e. parallel to the direction of any focusing magnetic fields in the vicinity of the anode 50 as described below, to reduce the opportunity for vapour deposition on the anodic surfaces and thus reduce diffusion losses.

Arc spot formation is confined by steering magnetic fields produced by a steering magnetic field source 60 comprising linear conductors 62 and 64 respectively disposed along the long sides 32a, 32b of the cathode plate 32 and linear conductors 66 and 68 respectively disposed along the short sides 32c, 32d of the cathode plate 32. In this embodiment the conductors 66, 68 are disposed behind the cathode plate 32 as in the previous embodiments, but the conductors 62, 64 are disposed in front of the cathode plate 32. The conductors 62, 64 are still disposed in the vicinity of the target surface 34 so that the magnetic fields generated thereby influence arc spot formation and motion, and the operation of the steering system 60 in this embodiment is substantially as described in respect of the embodiment of FIG. 2.

However, in the embodiment of FIGS. 4 to 6 the steering magnetic fields do not confine arc spots, as in the embodiment of FIG. 2, because the magnetic field lines are not arch-shaped and intersect the target surface 34 on only one side, as seen by the magnetic field lines shown in FIG. 5. Thus, because of the acute angle principle arc spots are guided toward the central region of the cathode plate 32, away from the acute angle formed where the magnetic field lines intersect the target surface 34. Arc spots therefore have a broader range of motion available in this embodiment. Moreover, in the embodiments in which the steering conductors are located behind the cathode plate 32, in which the portion of the steering magnetic fields projecting above the target surface 34 is closed (i.e. intersects the target surface 34 along both sides), the magnetic fields confine not only the arc spot but also the plasma generated as the target surface 34 evaporates. As shown in FIG. 5, by disposing the conductors 62, 64 in front of the target surface 34 the cathodic evaporate has an open path to the substrate holder 6.

Arc spots are thus guided toward the central region of the cathode plate 32, from both long sides 32a, 32b. To avoid creating a stagnation zone in the central region of the cathode plate 32, a conductive shield 54 maintained at floating potential is mounted to each anode holder 52, insulated therefrom and spaced from the target evaporation surface 34, which precludes any cathode spot activity in the central region of the cathode plate 12. Preferably the shield 54 is spaced from the target surface 34 between 2 mm and 6 mm; less than about 2 mm is likely to cause the arc to short circuit through the shield 54 and more than about 6 mm allows the arc spot to creep under the edges of the shield 54. The shield 54 thus prevents evaporation of the cathode 32 in the shadow of the anode 50, confining arc spot formation to an erosion zone 70 surrounding the shadow of the anode 50. This protects the anode 50 from deposition of cathodic evaporate and provides a better distribution of coating material over the substrates (not shown) mounted on the substrate holder 6.

One or more floating shields 54 may be positioned over any selected portion(s) of the target evaporation surface 34, to prevent arc spots from moving into the shielded region. In the embodiment illustrated the shield 54, positioned immediately above the target surface 34 in the vicinity of the anode 50, prevents arc spots from forming in or moving into the area of the target surface 34 surrounding the shield 54. This is advantageous in embodiments in which the steering conductors are disposed in front of the cathode plate 32. However, a floating shield 54 can be used to keep arc spots away from any desired region of the cathode plate 32. For example, the floating shield 54 allows the target evaporation surface of the cathode plate to be constructed of more than one material; in this case an expensive coating material such as tungsten or platinum can be omitted from the region beneath the shield 54, and since arc spots will not form or move in that region there is no possibility that the coating will be contaminated.

In operation, a current is applied between the anode 50 and the cathode plate 32 and a high pulse voltage applied to igniter 48 initiates a vacuum arc on the target evaporation surface 34 of the cathode plate 32. The arc spot settles in an erosion corridor 70 defined between the steering magnetic fields generated by the conductors 62, 64 and the shielded region of the target surface 34 behind the conductive shields 54. The arc spot follows a retrograde motion along one long side 32a or 32b of the target surface 34, and moves to the other long side 32b or 32a traveling beneath the apex of the magnetic field generated by the steering conductor 66 or 68 disposed behind the cathode plate 32. As the target surface 34 evaporates the plasma is guided between the magnetic fields generated by the conductors 62, 64 and flows toward the substrate holder 6, as shown by the arrows in FIG. 5.

Because the preferred embodiments of the invention employ a magnetic steering system, it is possible to use a plasma focusing system to guide the cathodic evaporate toward the substrate holder 6. A magnetic field forms a barrier which is largely opaque to plasma. Thus, focusing magnetic fields can be generated about the housing 38 to confine the plasma to a plasma flow region between magnetic fields, and positioning the substrate holder 6 in the plasma flow region to increases the concentration of plasma about the substrates and improves the quality of the coating.

In the embodiment illustrated in FIGS. 4 to 6 the conductors 62, 64, being disposed in front of the target surface 34 of the cathode plate 32, can also serve as focusing conductors in a plasma focusing system 80. A plasma flow path is defined between the magnetic fields generated by the conductors 62, 64, as shown by the magnetic field lines in FIG. 5, such that plasma is guided along a central region of the housing 38 to the substrate holder 6. In this embodiment it is advantageous to provide the short side steering conductors 66, 68 with separate power sources, which allows for the strength of their respective magnetic fields to be varied independently, to compensate for any distortion in the steering magnetic fields caused by the long side steering conductors 62, 64 and thus properly position the arc spot in the erosion corridor 70.

Figure 6B:
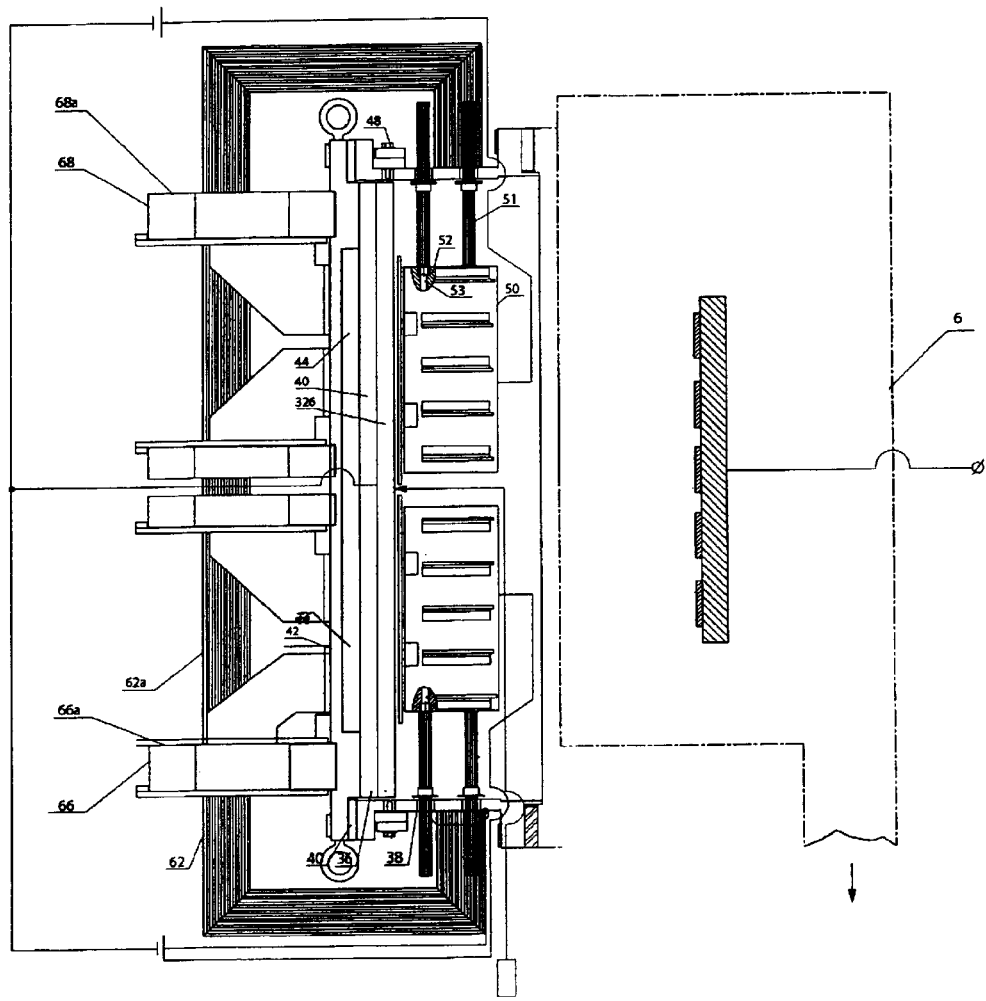
FIG. 6b is a cross-sectional elevation of a further embodiment of the apparatus of FIG. 4 having multiple pairs of steering conductors.

In the embodiment illustrated in FIG. 6b, a plurality of pairs of steering conductors 66, 68 are provided behind a single cathode plate 32, corresponding to the plurality of anodes 50. In this embodiment a separate erosion corridor can be provided for each anode 50, respectively associated with each pair of steering conductors 66, 68 parallel to the short sides of the cathode plate 32, because the two intermediate steering conductors 66, 68 prevent arc spots from migrating past the center of the cathode plate 32.

To focus the plasma flow, additional plasma focusing conductors may be provided in series to elongate the plasma flow path. For example, FIGS. 7a to 7d illustrate embodiments of the invention having a plurality of linear anodes 50 in which groups of plasma focusing conductors 82, 84 and 92, 94 are disposed on opposite sides of the housing 38 and, within each group, progressively further from the cathode 32. This creates a plasma confining zone between the magnetic fields generated on opposite sides of the housing 38, thus defining a plasma flow path between the target surface 34 and the substrate holder 6.

The focusing conductors 82, 84 and 92, 94 are preferably disposed too far from the cathode plate 32 to influence arc spot formation or motion. Preferably also the focusing conductors in each group 82, 84 or 92, 94 are disposed in closely spaced relation so that their respective magnetic fields overlap to create a continuous magnetic path confining the plasma flow and magnetically isolating the wall of the housing 38 from the plasma flow; otherwise plasma may be trapped against the walls of the housing 38. As in the case of the steering conductors, the closing conductors 82a, 84a of the focusing conductors 82, 84 and the closing conductors 92a, 94a of the focusing conductors 92, 94 are maintained well away from the housing 38 and the cathode plate 32 to eliminate any canceling effect of the magnetic fields generated thereby in the region of the housing 38 (plasma duct). In this embodiment it may be advantageous to provide the short side steering conductors 66, 68 with separate power sources, to compensate for any distortion in the steering magnetic fields caused by the focusing conductors 92, 94.

In the operation of this embodiment, as the target surface 34 evaporates the plasma is concentrated between the focusing magnetic fields generated by focusing conductors 82, 84 and 92, 94. The plasma thereby flows toward the substrate holder 6 without contacting the housing 38.

The focusing conductors 82, 84 and 92, 94 are preferably independently powered, so that the intensity of the magnetic field generated by each conductor 82, 84, 92, 94 can be varied independently of the others. Closed loop focusing conductors can be disposed around the housing 38, however in the preferred embodiments illustrated in FIGS. 7a, 7b pairs of independent focusing conductors 82 and 92, and 84 and 94, respectively, are disposed on opposite sides of the housing 38 parallel to the long sides 32a, 32b of the cathode 32. The closing conductors 82a, 84a, 92a and 94a are maintained well away from the housing 38 and the cathode plate 32.

Figure 8:
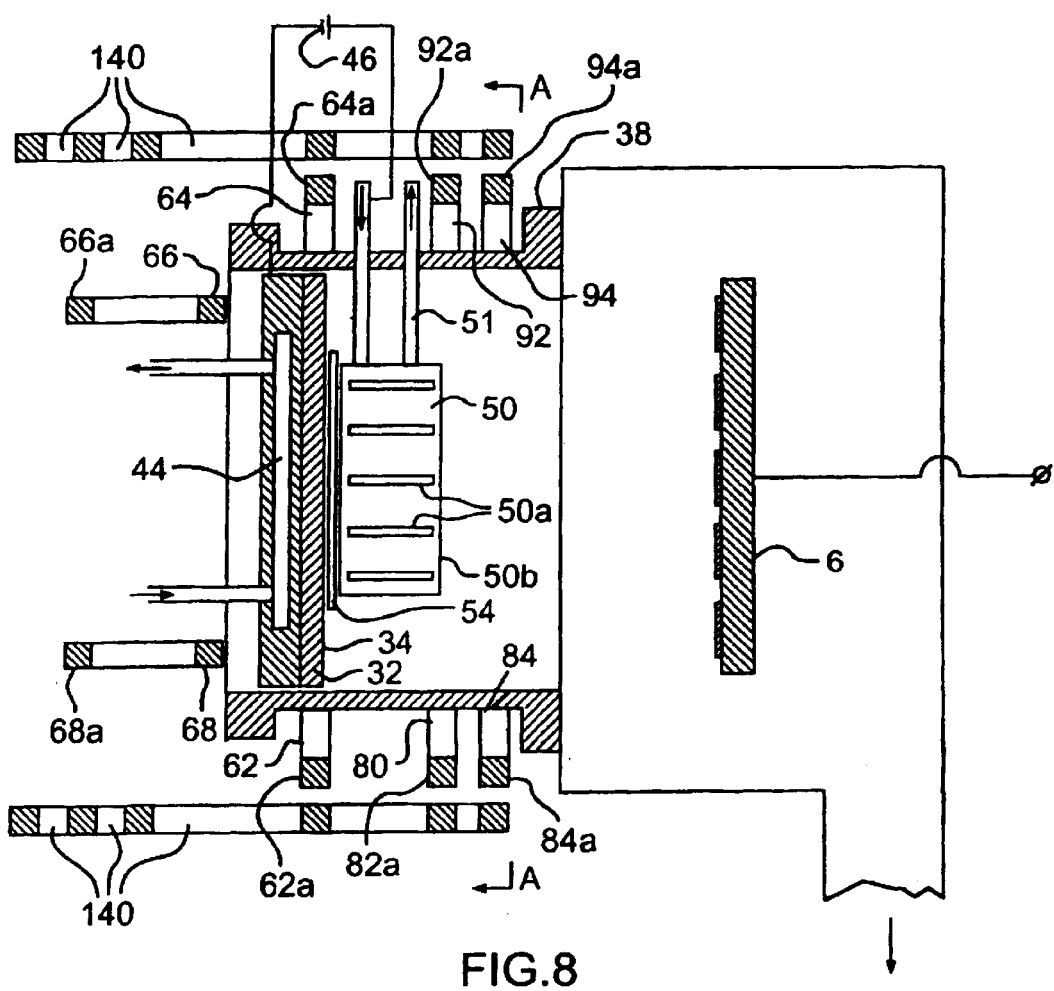
FIG. 8 is a plan view of a variation of the arc coating apparatus of FIG. 7a providing neutralizing conductors for modulating the steering and focusing conductors.

In a further embodiment illustrated in FIG. 8 the opposed focusing conductors 82, 92 and 84, 94 are formed from the same closed loop conductor with the focusing conductors 82, 92, 84 and 94 disposed parallel to the long sides 32a, 32b of the cathode 32 with closing conductors 82a, 92a, 84a and 94a disposed parallel to the short sides 32c, 32d of the cathode 32.

By connecting focusing conductors 82, 84 and 92, 94 independently to the power supply it is also possible to "raster" the plasma flow by varying the current through opposed focusing conductors 82, 92 and/or 84, 94. This helps to distribute the plasma more uniformly about the plasma duct and to create a more homogeneous plasma mixture. Within the coating chamber the focusing conductors 82, 84 and 92, 94 can be independently activated to deflect plasma toward the substrate holder 6.

FIG. 8 illustrates a mode of reducing the magnetic influence of the closing conductors 82a, 92a using neutralizing conductors 140 comprising closed-loop coils disposed alongside closing conductors 82a, 92a, but in an opposite orientation. When activated the neutralizing conductors 140 eliminate the influence of closing conductors 82a, 92a on the plasma flow. The neutralizing conductors 140 can also raster the plasma flow slightly in the vicinity of the walls of housing 38 parallel to the short sides 32c, 32d of the target 32.

In all embodiments the closing conductors 82a, 84a, 92a and 94a are maintained well away from the housing 38 and the cathode plate 32 to eliminate any canceling effect of the magnetic fields generated thereby in the region of the housing 38 (especially the plasma duct region of the housing 38).

Figure 9:
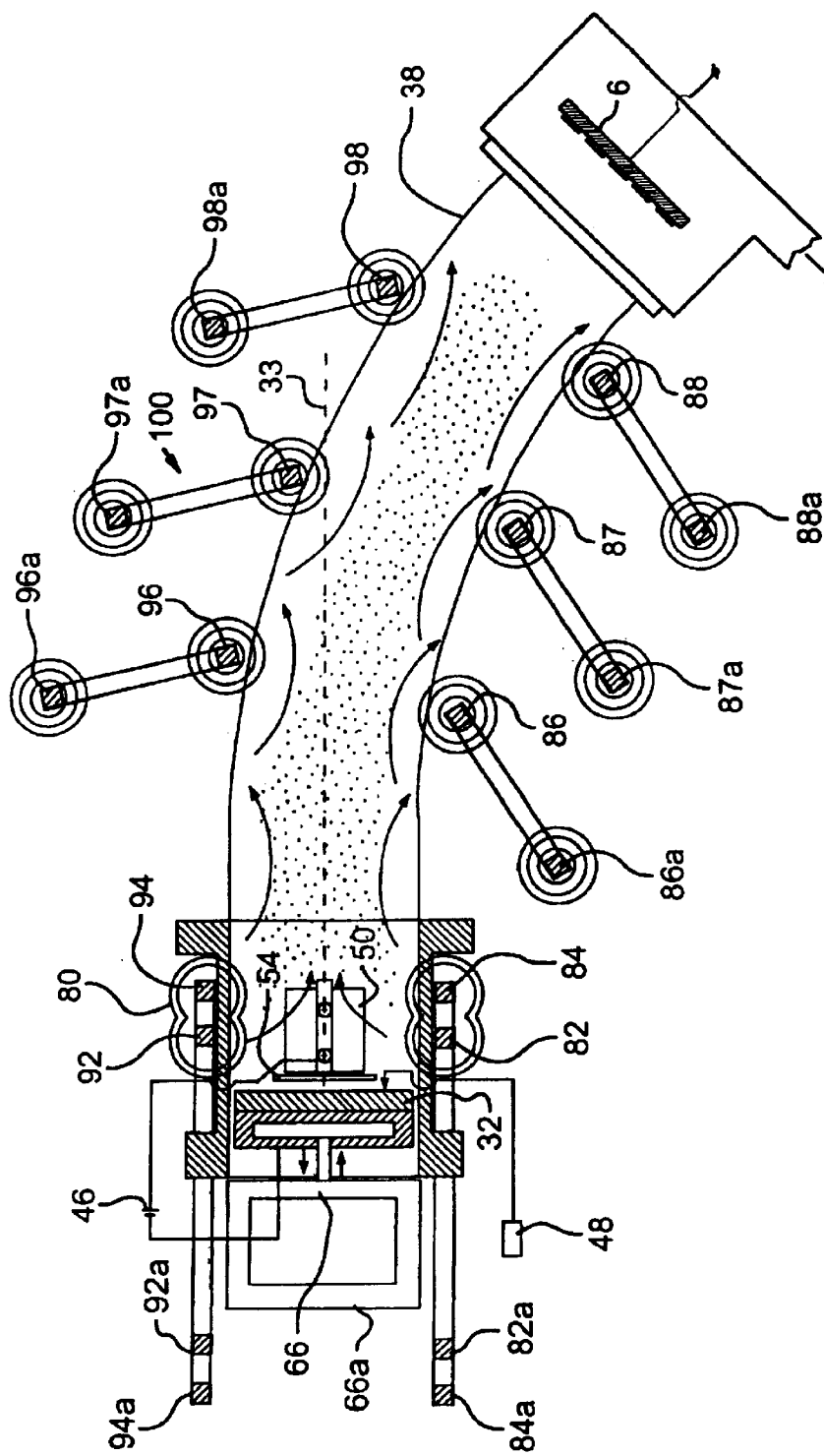
FIG. 9 is a plan view of an arc coating apparatus embodying a deflecting electromagnetic system according to the invention for guiding cathodic evaporate to a substrate holder disposed remote from the working axis of the cathode plate.

The plasma focusing system of the invention can also be used as a plasma deflecting system 100, allowing the substrate holder 6 to be disposed remote from the working axis of the cathode plate 32, designated 33 in FIG. 9, to eliminate from the plasma the neutral component (macroparticles, clusters and neutral atoms) which are unaffected by the focusing magnetic field and further improve the quality of the coating. As shown in FIG. 9, by arranging deflecting conductors 86, 87, 88 and 96, 97, 98 along a curvate housing 38 in a progressively asymmetrical pattern relative to the working axis 33 of the cathode plate 32, the plasma is deflected toward the substrate holder 6 while the inertia of the plasma causes the neutral component to separate from the plasma in the deflection region.

The conductors 86, 87, 88 and 96, 97, 98 thereby create a chain of deflecting conductors to form a deflecting electromagnetic system. As in the previous embodiments, closing conductors 86a, 87a, 88a and 96a, 97a, 98a are maintained well away from the housing 38 (especially the plasma duct region) and the cathode plate 32. The closing conductors 86a, 87a, 88a and 96a, 97a, 98a may be disposed on the same side of the housing 38 as the deflecting conductors 86, 87, 88 and 96, 97, 98 of the deflecting system, for example by disposing the closing conductors 86a, 87a, 88a and 96a, 97a, 98a well above or below the level of the housing 38. Alternatively the closing conductors 86a, 87a, 88a and 96a, 97a, 98a may be disposed on the opposite side of the housing 38 but remote therefrom, in which case it is preferable that the distance S between the closing conductors and focusing conductors arranged along opposite sides of the housing (for example focusing conductors 86, 87, 88 and closing conductors 96a, 97a, 98a) ranges from 1.5H to 3H where H is the width (transverse) of the housing 38.

In the operation of this embodiment, as the target surface 34 evaporates the plasma is concentrated between the magnetic fields generated by the conductors 62, 64 and flows into the deflection region defined between the magnetic fields generated by deflecting conductors 86, 87, 88 and 96, 97, 98. The plasma is thereby deflected along a flow path coinciding with the asymmetrical pattern of the deflecting conductors 86, 87, 88 and 96, 97, 98 and flows toward the substrate holder 6 without contacting the housing 38. The plasma remains confined between magnetic fields and is thereby deflected away from the working axis 33 of the cathode plate 32. The neutral component continues in a generally straight direction and settles on an interior wall of the housing 38 in the vicinity of the working axis 33 of the cathode plate 32, while the plasma continues along the plasma duct into the coating chamber to the substrate holder 6.

Figure 10:
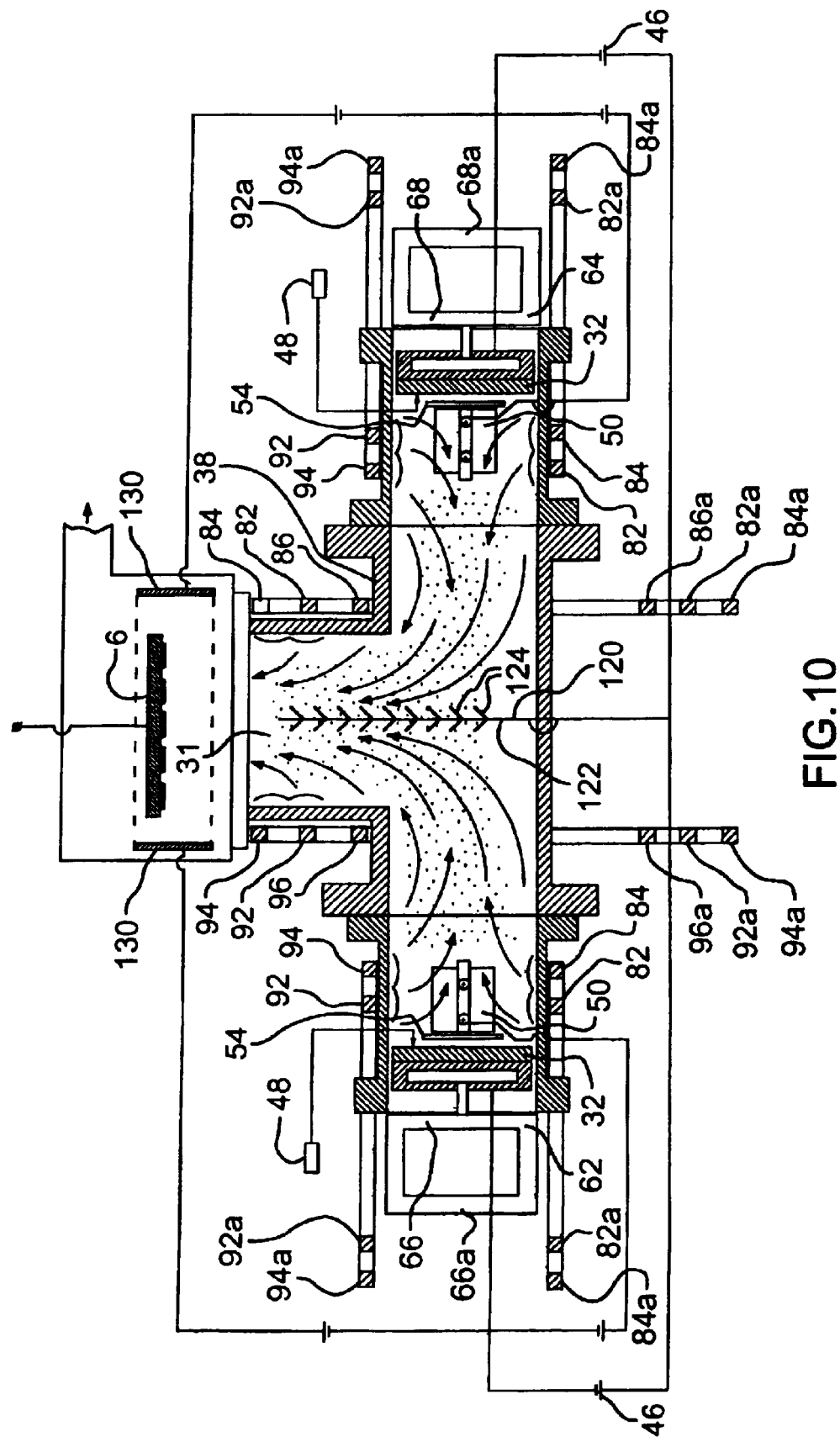
FIG. 10 is a plan view of a dual arc coating apparatus embodying the magnetic steering, focusing and deflecting aspects of the invention.

FIG. 10 illustrates a preferred embodiment of an arc coating apparatus according to the invention, providing a pair of cathode plates 32 disposed in a cathode chamber at opposite ends of the housing 38, in communication with the substrate holder 6 through a parallelipedal plasma duct 31. Internal linear anodes 50 configured as described above are suspended above each target surface 34, separated therefrom by a shield 54. Anodes 50 are defined herein as "internal" because they are disposed within the plasma duct, which is defined between the cathode plates 32 and the substrate holder 6.

A further internal anode, deflecting electrode 120 comprising a linear plate 122 having baffles 124, is disposed along the plasma duct 31 at the approximate center between the two cathode plates 32. The baffles increase the anodic surface area, effectively functioning as a chain of internal anodes, which provides better stabilization and steering of arc spots. They also serve to trap macroparticles emitted from the evaporation surface 34. As in the previous embodiment, the baffles 124 are oriented as much as possible parallel to the direction of the magnetic field to reduce diffusion losses. This "dividing" anode 120 also serves to repel ions and thus deflect the plasma streams toward the substrate holder 6.

In this embodiment focusing conductors 82, 84, 92 and 94 are disposed parallel to the long sides 32a, 32b of the cathode plates both about the regions in front of the cathode plates 32 and about the exit of the plasma duct 31 in the coating chamber. In between the sets of focusing conductors 82, 92 and 84, 94, deflecting conductors 86, 96 are disposed about the portion of the housing 38 where the plasma duct 31 turns toward the axis of the substrate holder 6, i.e. adjacent to a portion of the housing 38 containing the cathode plates 12, creating opposed magnetic cusps directed perpendicular to the axis of the cathode chamber, to thus deflect plasma toward the substrate holder 6. In the embodiment shown the closing conductors 82a, 84a, 86a, 92a, 94a and 96a must be disposed remote from the plasma duct 31 in order to ensure that the cathode plates 32 are disposed only within the magnetic cusps generated by the focusing and deflecting conductors 82, 84, 92, 94 and 86, 96, so that cathodic evaporate is drawn into the plasma duct 31 and not toward the back wall of the housing 38. Alternatively, as in the embodiment of FIG. 9 the closing conductors 82a, 84a, 86a and 92a, 94a, 96a may be disposed on the opposite side of the housing 38 but remote therefrom.

The embodiment of FIG. 10 also provides one or more external anodes 130 surrounding the substrate holder 6. Anodes 130 are defined herein as "external" because they are disposed outside of the plasma duct 31. Thus, the external anodes 130 do not deflect the plasma, but instead repel ions to prevent diffusion losses on the walls of the housing 38 and prolong ionization of the coating material to improve coating efficiency. Such external anodes 130 can also be provided about any desired portion of the housing 38.

Further, since the housing 38 is insulated from the cathode plates 32 by dielectric spacers 39, the housing 38 may be left at floating potential as shown in the Figures. Alternatively, providing a floating potential screen or shielding (not shown) between the cathode 32 and the housing 38 to prevent the arc from moving into a gap between the cathode 32 and the housing, will effectively turning the housing 38 into an external or surrounding anode.

The internal anodes 32, 120 and external anode 130 are preferably electrically isolated and thus each is provided with an independent power supply, which allows for better control over their independent functions.

It is also possible to differentially activate the focusing conductors 82, 84 and 92, 94 to trap the metal vapour component of the plasma within the plasma duct while allowing the electron current to flow freely through the coating chamber to the auxiliary anodes 130 surrounding the substrate holder 6. This mode of operation is a "plasma immersed" mode, which provides a high degree of ionization and activation of the gaseous plasma environment in the coating chamber without deposition of metal cathodic arc plasma coatings. The plasma immersed mode supports several different types of plasma processes, such as fast ion cleaning, ion nitriding, ion implantation, and arc plasma-assisted low pressure CVD coating processes. For example, the first stage of a particular coating process may require ion cleaning. The cathodic arc sources 34 may be used as a powerful electron emitters, to extract electron current from the cathode to the external anode 130 surrounding the substrate holder 6, providing a plasma immersed environment for fast ion cleaning. Argon, nitrogen, methane etc. may be injected as a plasma-created gas in conjunction with an RF generator providing a self bias potential at the substrate holder for effective ion bombardment, as illustrated by the examples.

Figure 7A:
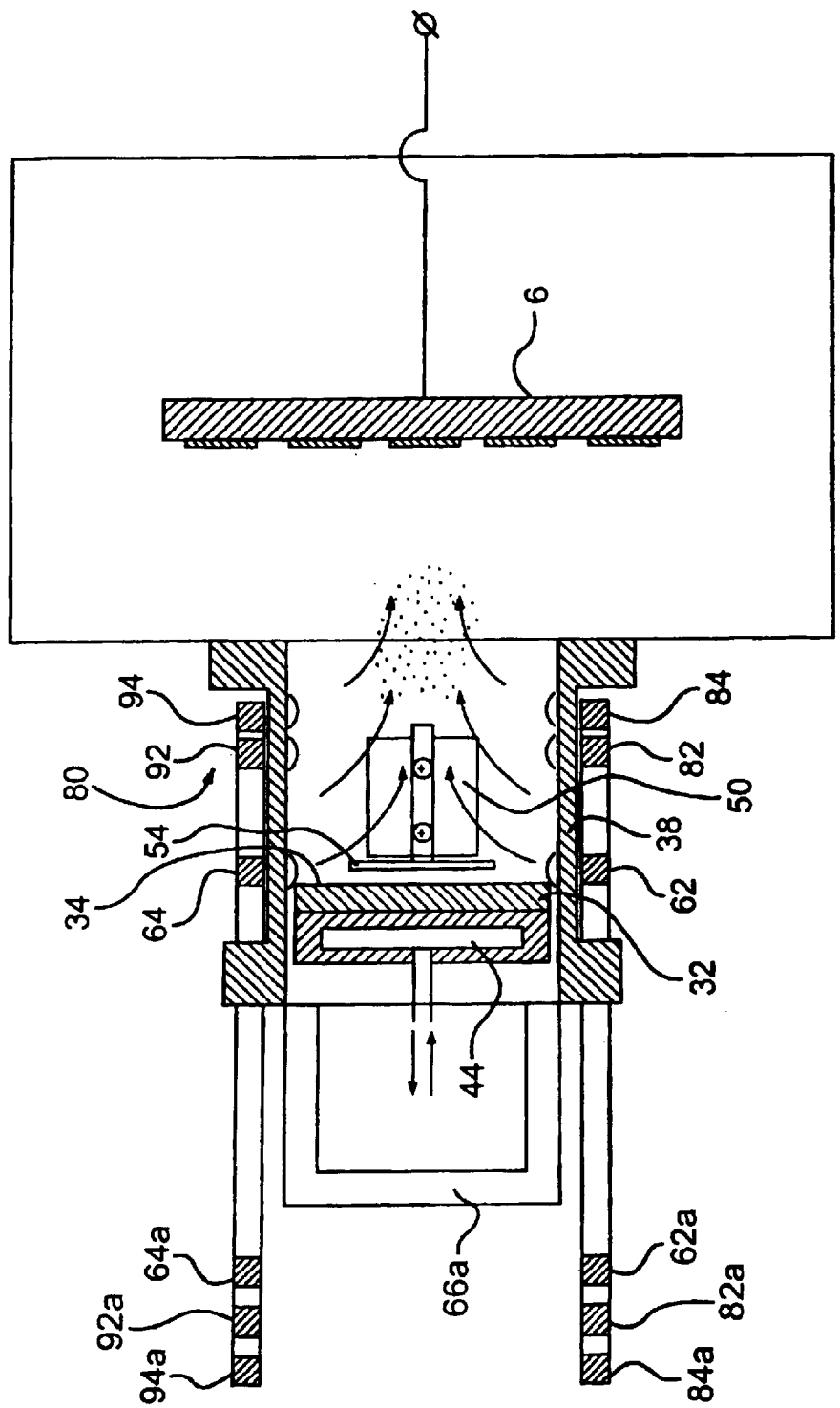
FIG. 7a is a plan view of an arc coating apparatus embodying a plasma focusing system according to the invention having a plurality of linear anodes and a single cathode target.
Figure 7B:
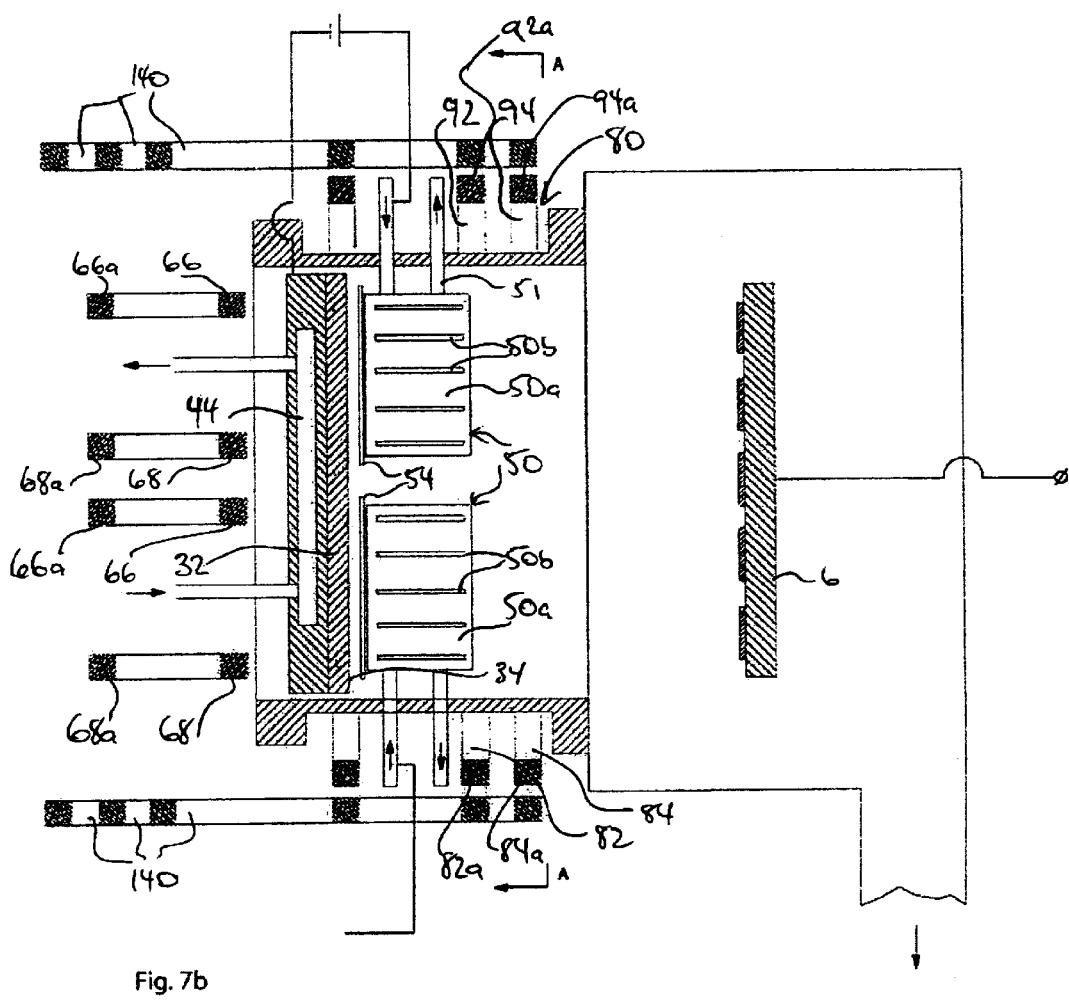
Figure 7C:
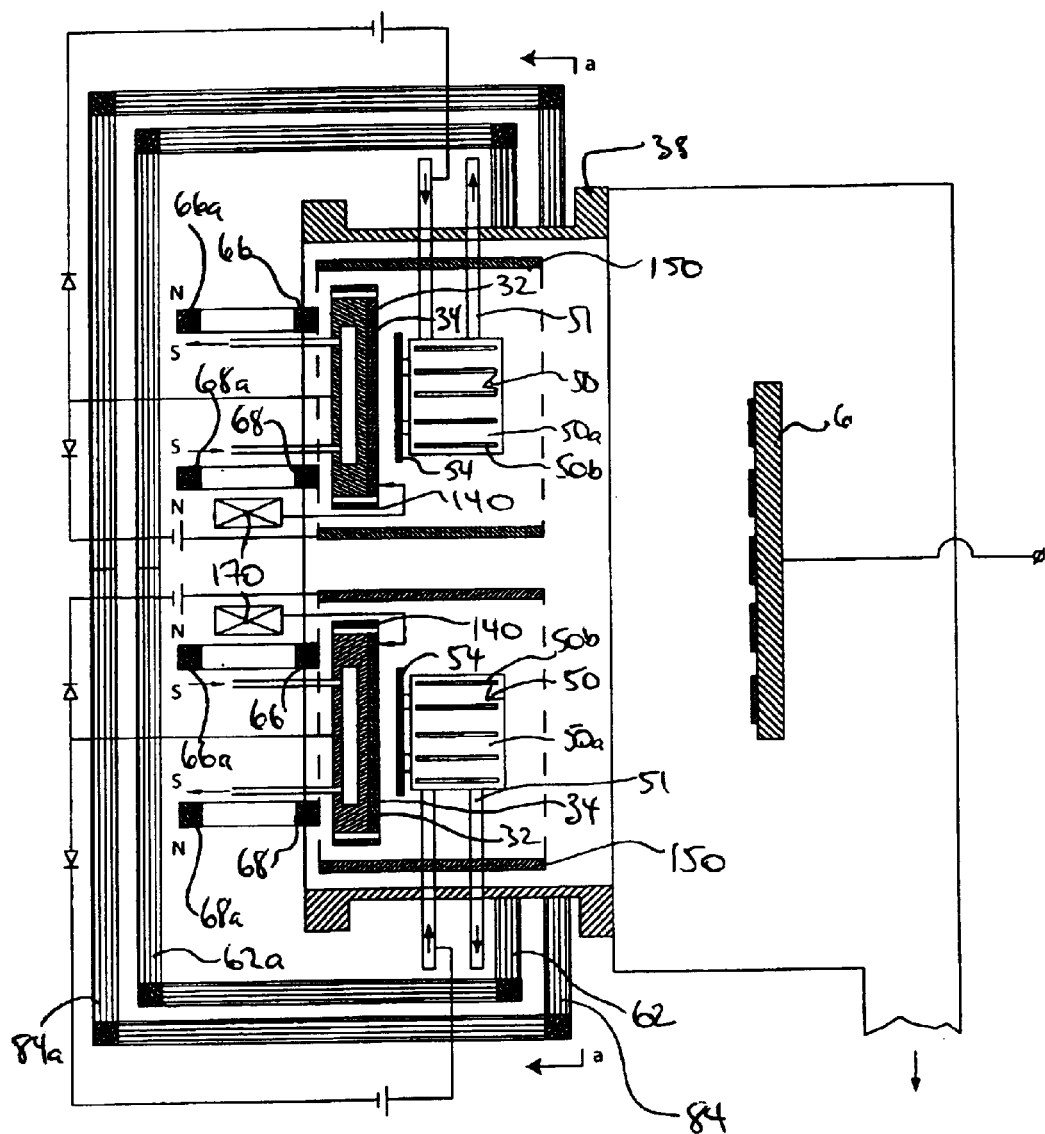
FIG. 7c is a side elevation of the arc coating apparatus of FIG. 7a with plurality of cathode targets installed in the same housing.
Figure 7D:
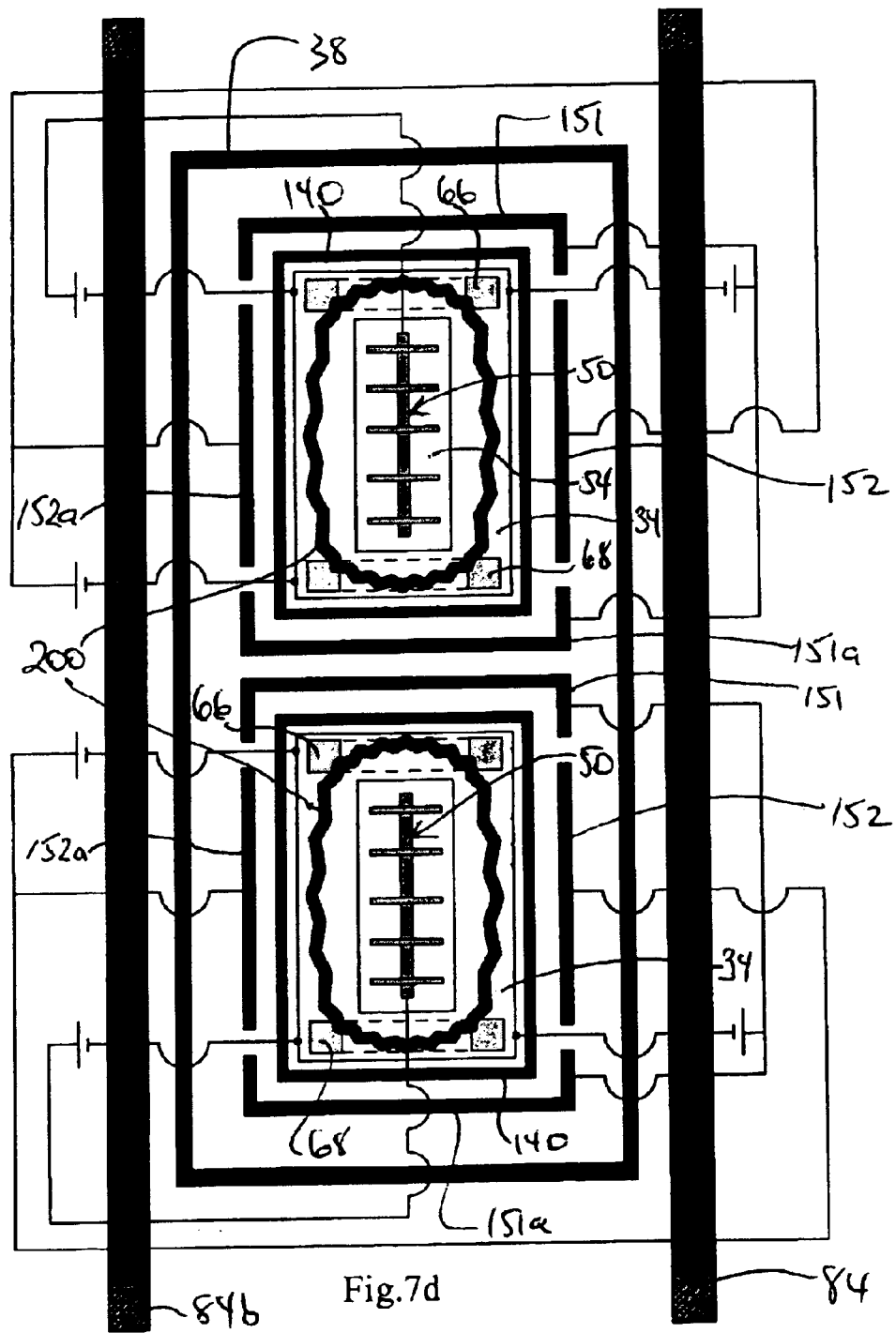
FIG. 7d is a plan view of an arc coating apparatus of FIG. 7c.

FIGS. 7c and 7d illustrate a further embodiment of the invention, similar to the embodiment of FIGS. 7a and 7b but providing multiple rectangular cathode targets incorporated in one rectangular cathodic arc source unit. Housing 38 contains two rectangular cathode assemblies consisting of target plates 34 attached to water cooled target holder 32 and vacuum arc ignitors 170. Each cathode target assembly is surrounding by an insulated shield 140, which prevents cathodic arc spots from moving toward side surface of the cathode assembly. Central anode 50 can be optionally installed in front of the cathode target plate 32. The insulated shield 54 can be installed in a central area of the target plate 32, to prevent cathodic arc spots from moving toward central area of the target where the steering magnetic field component that is tangential to the plate surface 34 is not sufficient to confine arc spots within the erosion corridor 200. Two pairs of focusing magnetic coils 84 and 62 are using to steer cathodic arc spots along long sides of the targets 32, while simultaneously focusing the plasma flow toward the substrate holder 6 installed in the main vacuum chamber. Another pair of magnetic coils 66, 68 is disposed on a back side of each cathode assembly. The linear conductors 66, 68 are parallel to the short sides 32c, 32d of the cathode targets 32, providing steering of cathodic arc spots along short sides of the target surface 34. Conductors 66, 68 must be installed with opposite polarities, providing steering of cathodic arc spots in the same direction as adjacent focusing conductors 62, 84 steering cathodic arc spots along the erosion corridor 200. Surrounding anodes 150 can be optionally sectioned or partitioned, providing independent anodic current circuits for cathodic arc spots located both near the short sides 32c or 32d of the target plate 32 (anodic pair 151–151a in the embodiment shown in FIG. 7d) and long sides 32a or 32b of the cathode target 32 (anodic pair 152–152a in the embodiment shown in FIG. 7d). This also allows for the detection of cathodic arc spots stagnating near the short sides or long sides of the target surface 34. As soon cathodic arc spots are located near either short or long side of the target surface 34 for time longer than $t_s \sim l_s/v_s$, (where $l_s$ is a length of a short or long side of the cathode target plate 34, $v_s$ is a velocity of a movement of cathodic arc spots under influence of steering magnetic field), the arc current can be turned off to eliminate the arc spots, followed by re-ignition of the arc by igniters 170. Sectioning or partitioning the anodes, including both surrounding 151, 152 and central 50, allows for the optimal distribution anodic arc current to provide maximum reliability of steering of arc spots inside of erosion corridor 200.

Alternatively, instead of a shield (either a shield 140 around the cathode plate 32 or a shield 54 covering the stagnation zone in front of the evaporation surface 34), the cathode plate 32 can be surrounded by a material that has a very low cathodic arc spot sustainability, or this material can be inserted in the area of the cathode plate 32 where arc spots are stagnating. For example tungsten, molybdenum, boron nitride-based ceramics etc., can be used to prevent arc spots from moving in undesirable areas of the evaporation surface 34.

Figure 11:
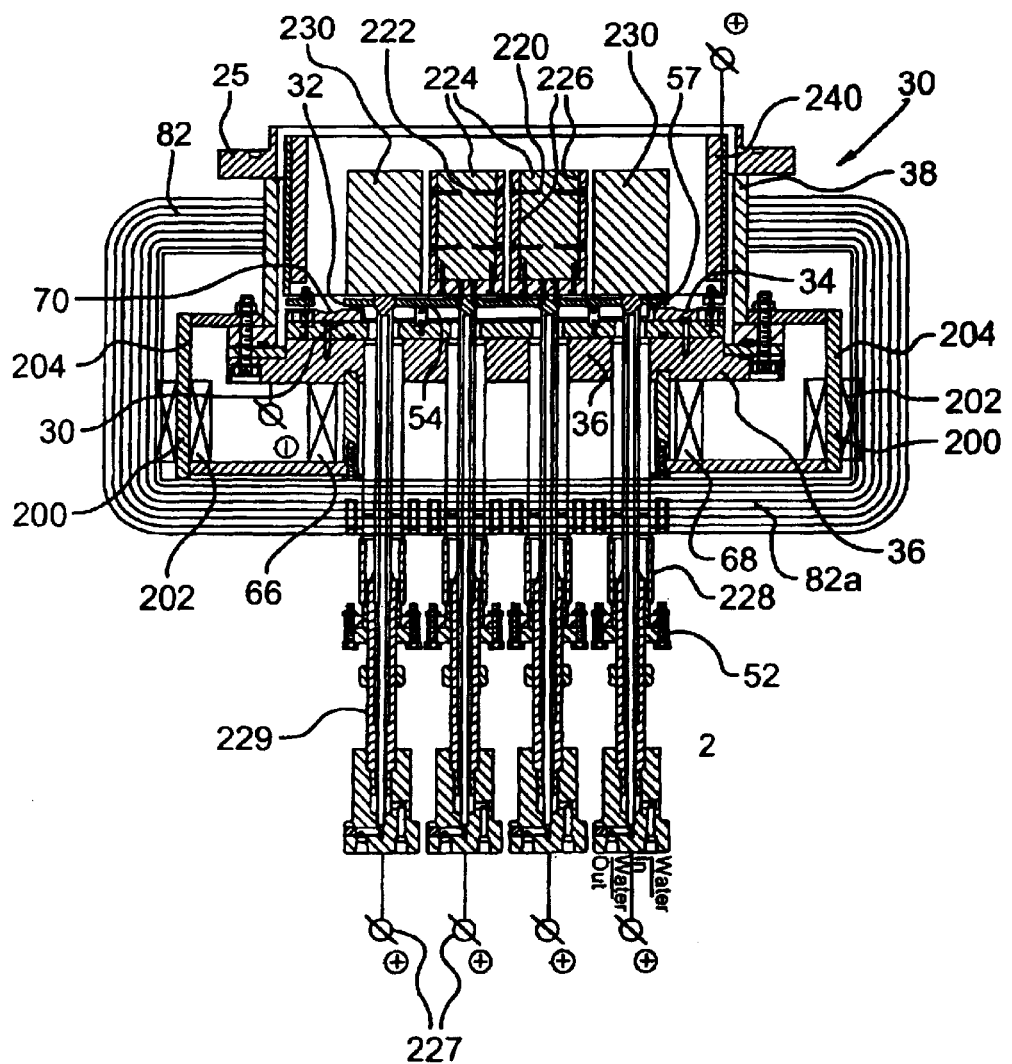
FIG. 11 is a cross-sectional side elevation of a further embodiment of the arc coating apparatus according to the invention.
Figure 12:
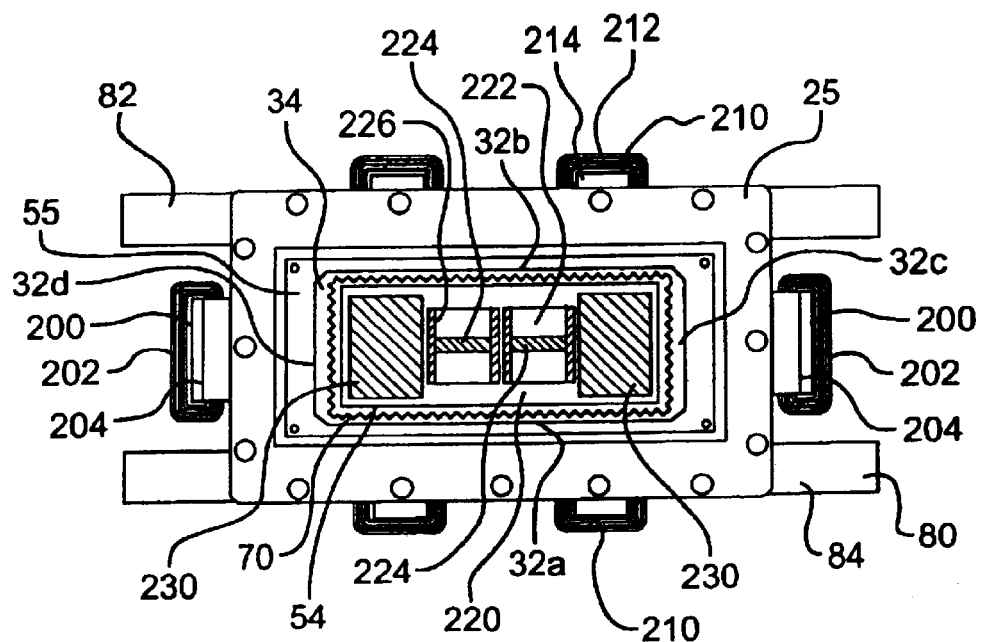
FIG. 12 is a cutaway front elevation of the arc coating apparatus of FIG. 11.
Figure 13:
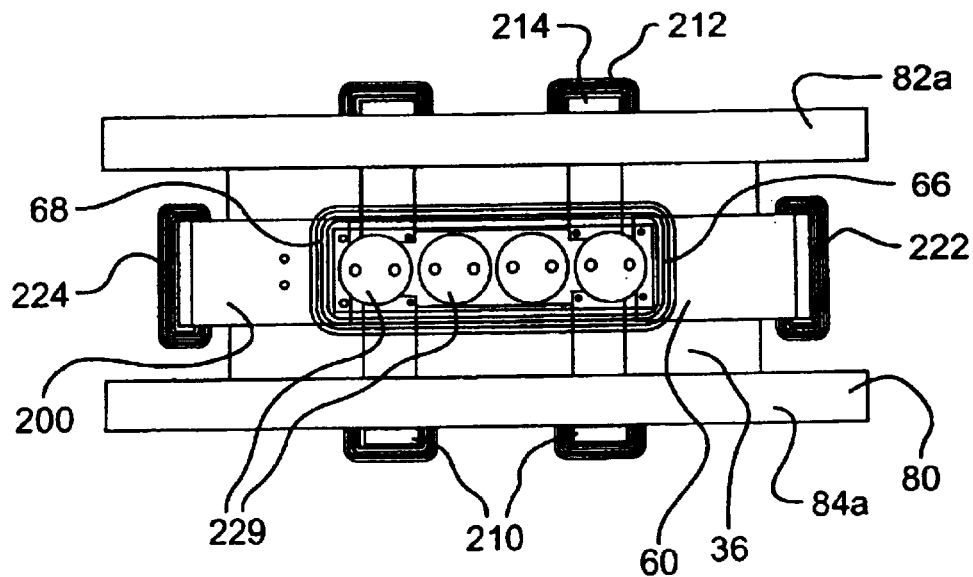
FIG. 13 is a rear elevation of the arc coating apparatus of FIG. 11.

FIGS. 11 to 13 illustrate a further embodiment of the invention providing local correctional magnets 200 and 210 for guiding the arc spot between one long side 32a of the cathode plate 32 and the other long side 32b, and providing a different anode arrangement.

Short side correctional magnets 200 preferably each comprise at least one magnetic coil 202 surrounding an electromagnetic core 204, and are respectively disposed along the short sides 32c, 32d of the cathode plate 32. The core 202 concentrates the magnetic field generated by the coil 202, so that when the coil 202 is activated the arc spot is constrained to move along the arc-shaped magnetic field lines which extend over the short side 32c or 32d of the cathode plate 32.

In this embodiment long side correctional magnets 210 are also provided along both long sides 32a, 32b of the cathode plate 32, near the short sides 32c, 32d, to similarly constrain the motion of the arc spot as the arc spot nears the short sides 32c, 32d. Long side correctional magnets 210 similarly preferably each comprise at least one magnetic coil 212 surrounding an electromagnetic core 214 which concentrates the magnetic field generated by the coil 212, so that when the coil 212 is activated the arc spot is constrained to move across the magnetic field lines in a direction transversal to the arc-shaped magnetic field lines which extend over the ends of the long side 32a or 32b.

The directions of the magnetic field lines generated by the correctional magnets 200, 210 must correspond to the motion of the arc spot along the long sides 32a, 32b as determined by the steering conductors 66, 68 (shown in FIG. 11). The correctional magnets 200, 210 act on the arc spot only as it nears and traverses the short sides 32c, 32d of the cathode plate 32, to maintain an uninterrupted steering pattern about the cathode plate 32. The strength of the magnetic fields generated by the correctional magnets 200, 210 can be varied by varying the current through the coils 202, 212 or by providing additional coils (not shown) surrounding the cores 204, 214 which can be selectively activated to superimpose an additional magnetic field onto the core 204 or 214.

In this embodiment a linear internal anode 220 comprises a series of anode blocks 222 and 230. Interior anode blocks 222 provide an anode plate 224 and baffles 226 disposed generally orthogonally in relation to an anode plate 224. As in the previous embodiments the anode plate 224 and baffles 226 are each oriented in a direction parallel to the direction of the plasma flow. The anode 220 further includes end anode blocks 230, preferably comprising solid water-cooled blocks, which serve to isolate the interior regions of the anode 220 from cathodic evaporate eroded from the short sides 32c, 32d of the cathode plate 32. The use of separate "blocks" helps to better distribute the arc current and reduces reliance upon a single anode body.

The anode blocks 222, 230 are preferably independently controlled by separate power supplies 227 disposed through water-cooled anode pipes 229, mounted to and insulated from the housing (not shown) by insulating spacers 228. The strength of the current through an anode block 222 or 230 determines the absence or presence of an arc spot, and thus suitable software can be employed to raster or scan through the blocks 222, 230 within the anode 220 in concert with the motion of the arc spot about the erosion zone 70. This arrangement helps to reduce the interval during which the arc spot is passing from one long side of the cathode 32 to the other. Moreover, if the arc spot stagnates at any point along the erosion corridor 70, the power supply to an adjacent anode block 222 or 230 can be deactivated or reduced, and/or the power supply to a more remote anode block 222 or 230 can be activated or increased, to keep the arc spot in motion.

The linear focusing conductors 82 and 84 shown in FIG. 12 (partially concealed by the flange 250) are respectively disposed in front of the evaporation surface along the long sides 32a, 32b of the cathode plate 32. Focusing conductors 82, 84 produce a tangential magnetic field which steers (drags) the arc spot along long sides 32a, 32b of the cathode plate 32. Because they are disposed in front of the evaporation surface 34, the focusing conductors 82, 84 create a magnetic cusp directed toward the coating chamber 38 (similar to that indicated by the arrows FIG. 5). The cusp configuration tends to guide arc spots toward the center of the cathode 32, which renders the shield 54 particularly advantageous in this embodiment as it prevents the arc spot from moving into the shadow of the anode 220, where the magnetic field lines are generally perpendicular to the evaporation surface 34 and without the shield 54 would create a stagnation zone in the center region of the cathode 32.

In this embodiment the closing conductors 82a, 84a are disposed behind the evaporation surface 34 along the long sides 32a, 32b of the cathode plate 32 produce a magnetic field having an arch shape over the evaporation surface 34, which balance the acute cusp-shaped magnetic field lines produced by the focusing conductors 82, 84 and act in conjunction with the steering conductors 66, 68 respectively disposed along the short sides 32d, 32c of the cathode plate 32, along with the correctional magnets 200, 210 which also guide arc spots along the short sides 32d, 32c of the cathode plate 32, to guide arc spots in the same direction around the erosion zone 70.

Thus, the conductive shield 54 spaced from the target evaporation surface 34, together with a border shield 55 disposed about the periphery of the cathode plate 32, precludes any cathode spot activity outside of the desired erosion zone 70. In the embodiment shown an internal shield 57 is provided beneath the shield 54, which also serves to prevent cathode spot activity in the shadow of the anode 220.

In the embodiment of FIGS. 11 to 13 a surrounding anode 240 is provided around the evaporation surface 34, generally orthogonally thereto. The surrounding anode 240, which is disposed in front of the evaporation surface 34, becomes a plasma-immersed anode which improves current exposure to the plasma flow and provides a more stable arc current surrounding the primary anode 220. The apparatus of the invention will operate with either the "internal" anode 220 or the surrounding anode 240; however, operation of the apparatus is improved by employing both anodes 220, 240 simultaneously.

EXAMPLE 1

Deposition of a diamond-like coating (DLC) on set of knives such as scalpels, razors, knives for cutting papers using two rectangular arc sources mounted in the dual rectangular plasma guide chamber of FIG. 10 with deposition zone 500 mm height×300 mm width. The array of knives was installed on a rotating substrate platform facing the filtered arc source over the entire area of the deposition zone, with uniform rotation speed between about 10 to 20 rpm. A graphite rectangular plate evaporation target was attached to the cathode plate assembly. The current in the vertical steering conductors was set to 2000 amps, and the current in the horizontal steering conductors was set to 1300 amps. The arc current between the cathode and the primary (internal) anode plate was set to 300 amps. After igniting the arc with an impulse high voltage igniter, the arc spot began moving along an erosion corridor with an average speed ranging from 20 to 30 cm/s. About three to five cathodic arc spots subsisted simultaneously on the target surface. The current in the deflecting coils was set to 1500 amps each.

The first stage of the process involved ion cleaning. At this stage the cathodic arc sources were used as a powerful electron emitters. The deflecting conductors were turned off and electron current was extracted from the cathode to the auxiliary (external) anode surrounding the substrate platform, providing a plasma immersed environment for fast ion cleaning. Argon was injected as a plasma-created gas with pressure of about $4 \times 10^{-2}$ Pa and an RF generator provided a 400 volt self bias potential at the substrate platform for effective ion bombardment.

During the deposition stage the pressure in the vacuum chamber was set to $10^{-3}$ Pa. The RF generator having a 13.56 MHz frequency provided a self bias potential ranging from 40 V to 60 V during deposition. The deflecting coils were turned off during deposition periodically with a duty cycle of 20 s on/5 s off to prevent overheating of the coating. The time of deposition was 20 minutes. The thickness of the coating, as measured by micro cross section, ranged from 0.3 to 0.35 mkm which corresponds to a deposition rate of about 1 mkm/hr with a uniformity of +/−10%.

EXAMPLE 2

Deposition of graphite coating on molybdenum glass for using as a substrate for flat panel display using rectangular molybdenum glass plates with dimensions 400 mm height× 200 mm width×3 mm thick installed vertically on the rotating substrate platform. Each glass plate was attached to a metal plate-holder and a self bias of about 150 V was applied to the substrate platform using an RF generator with a 13.56 MHz frequency. The dual filtered cathodic arc source of FIG. 10 was provided with one aluminum target evaporation surface and one graphite target evaporation surface. The pressure during coating deposition was maintained at about $10^{-3}$ Pa. The temperature during deposition of the graphite coating was about 400° C., provided by an array of radiative electrical heaters.

In the first stage the arc was ignited on the aluminum target, providing an aluminum sublayer with thickness about 50 nm. In the second stage a graphite coating with thickness about 150 nm was deposited over the aluminum sublayer during a coating interval of 30 minutes.

EXAMPLE 3

Deposition of TiAlN coatings on an array of hobs and end mills. The array of hobs and end mills was installed on substrate platform facing the filtered arc source exit over the entire area of the deposition zone, the substrate platform having a double (satellite) rotation with platform rotation speed 12 rpm. The dual rectangular filtered arc source of FIG. 10 was provided with an aluminum target evaporation surface mounted to one cathode and a titanium target evaporation surface mounted to the second cathode, for deposition of the TiAlN coating. The current for the titanium target was set at about 150 amps while current for the aluminum target was set at about 60 amps.

In the first stage the current of the auxiliary (external) anode was set at about 70 amps, providing a high density gaseous plasma immersed environment during both fast ion cleaning and coating deposition. The self bias potential of substrate platform provided by a RF 13.56 MHz generator was maintained at about 400 volts during ion cleaning in argon, and at about 40 volts during deposition of TiAlN coating in nitrogen. The time for ion cleaning was 5 minutes, and for deposition was about 2 hours. The argon pressure during ion cleaning was set at $6 \times 10^{-2}$ Pa of argon, and for the deposition stage it was set at $2 \times 10^{-2}$ Pa of nitrogen. The deposition rate for TiAlN coating for double rotated hobs and end mills was found to be about 1–1.5 µm/hr.

EXAMPLE 4

Deposition of multi-layer coatings on dies and molds. An array of forging dies and extrusion molds was installed on the substrate platform with uniform rotation speed 20 rpm facing the filtered arc source exit in the dual rectangular filtered arc source of FIG. 10, for the deposition of Ti/TiN multi-layer coating with thickness ratio 0.05 µm of Ti and 0.3 µm of TiN. Before deposition of the coatings fast ion cleaning and arc plasma immersed ion nitriding was performed to provide gradually increased hardness of near surface layer in a transition zone between bulk material of coating parts and the coating layer. The thickness of nitriding layer was about 40 µm, provided by an auxiliary arc discharge with the current of auxiliary (external) anode set at about 90 amps and a pressure of nitrogen set at about $6 \times 10^{-2}$ Pa. The number of coating layers was 11 with total thickness about 3.5 µm. The current of the auxiliary anode during the deposition stage was set at about 120 amps, providing maximum total current at both titanium targets of about 500 amps. The DC bias during the ion cleaning/ion nitriding stage was set at about 200 volts, and during the deposition stage the current was reduced to 40 volts. The temperature of substrates was maintained at about 400° C. during all stages of the vacuum plasma treatment cycle.

Preferred embodiments of the invention having been thus described by way of example, modifications and adaptations will be apparent to those skilled in the art. The invention includes all such modifications and adaptations as fall within the scope of the appended claims.

I claim:

1. A vacuum arc coating apparatus comprising at least one rectangular cathode plate having opposed long sides connected to a negative pole of an arc current source, the at least one cathode plate having an evaporation surface, a coating chamber defined by the evaporation surface and a housing, a substrate holder within the coating chamber, a plurality of anodes within the coating chamber spaced from the evaporation surface, connected to a positive pole of a current source, an arc igniter for igniting an arc between the at least one cathode and each anode and generating arc spots on the evaporation surface, and a magnetic steering system comprising at least first and second steering conductors arranged along opposite sides of the at least one cathode plate, the first steering conductor carrying a current in a direction opposite to a direction of current in the second steering conductor, the first and second steering conductors each being disposed in the vicinity of the evaporation surface so that a magnetic field generated thereby exerts a magnetic influence on the arc spot, the first steering conductor being electrically independent of the second steering conductor, wherein by varying a level of current applied through the first steering conductor relative to the second steering conductor the arc spot shifts toward a long side of the at least one cathode plate.

2. The apparatus of claim 1 in which the first and second steering conductors are substantially linear.

3. The apparatus of claim 1 in which the first and second steering conductors are oriented substantially parallel to the long sides of the cathode plate.

4. The apparatus of claim 3 in which steering conductors are also provided along short sides of the cathode plate.

5. The apparatus of claim 4 comprising a plurality of cathode plates, in which separate steering conductors are provided along short sides of each cathode plate.

6. The apparatus of claim 5 in which the first and second steering conductors extend along the long sides of all of the plurality of cathode plates.

7. The apparatus of claim 1 in which focusing conductors are provided along the long sides of the cathode plate.

8. The apparatus of claim 7 in which magnetic fields generated by the focusing conductors confine a flow of plasma from the cathode plate to the substrate holder.

9. The apparatus of claim 4 in which adjacent to one cathode plate are provided a plurality of pairs of steering conductors parallel to the short sides of the one cathode plate and having opposite polarities, to shift arc spots toward a long side of the one cathode plate both at the ends of the one cathode plate and at an intermediate portion of the one cathode plate.

10. The apparatus of claim 1 in which each of the plurality of anodes has an associated shield covering an area of the at least one cathode in which arc spots are likely to stagnate.

11. A vacuum arc coating apparatus comprising at least one rectangular cathode plate having opposed long sides and opposed short sides and connected to a negative pole of an arc current source, the at least one cathode plate having an evaporation surface, a coating chamber defined by the evaporation surface and a housing, containing a substrate holder, at least one anode within the coating chamber spaced from the evaporation surface, connected to a positive pole of a current source, an arc igniter for igniting an arc between the cathode and the anode and generating an arc spot on the target evaporation surface, and a magnetic steering system comprising at least first and second steering conductors respectively arranged behind the evaporation surface along the short sides of the at least one cathode plate, the first steering conductor carrying a current in a direction opposite to a direction of current in the second steering conductor, the first and second steering conductors being electrically independent and being disposed in the vicinity of the evaporation surface so that a magnetic field generated thereby exerts a magnetic influence on the arc spot, wherein the magnetic fields generated by the steering conductors are oriented in the same direction in front of the evaporation surface such that a level of current through the first and second steering conductors can be varied independently to thereby direct arc spots in a desired direction around the evaporation surface.

12. The apparatus of claim 11 in which the first and second steering conductors are substantially linear.

13. The apparatus of claim 11 in which the first and second steering conductors are oriented substantially parallel to the long sides of the cathode plate.

14. The apparatus of claim 13 in which steering conductors are also provided along short sides of the cathode plate.

15. The apparatus of claim 14 comprising a plurality of cathode plates, in which separate steering conductors are provided along short sides of each cathode plate.

16. The apparatus of claim 15 in which the first and second steering conductors extend along the long sides of all of the plurality of cathode plates.

17. The apparatus of claim 11 in which focusing conductors are provided along the long sides of the cathode plate.

18. The apparatus of claim 17 in which magnetic fields generated by the focusing conductors confine a flow of plasma from the cathode plate to the substrate holder.

19. The apparatus of claim 14 in which adjacent to one cathode plate are provided a plurality of pairs of steering conductors parallel to the short sides of the one cathode plate and having opposite polarities, to shift arc spots toward a long side of the one cathode plate both at the ends of the one cathode plate and at an intermediate portion of the one cathode plate.

20. The apparatus of claim 11 in which each of the plurality of anodes has an associated shield covering an area of the at least one cathode in which arc spots are likely to stagnate.

* * * * *